(12) United States Patent
Park et al.

(10) Patent No.: US 11,976,364 B2
(45) Date of Patent: May 7, 2024

(54) METHOD FOR SELECTIVELY MANUFACTURING MATERIAL LAYER AND TARGET PATTERN

(71) Applicant: INDUSTRY-UNIVERSITY COOPERATION FOUNDATION HANYANG UNIVERSITY ERICA CAMPUS, Ansan-Si (KR)

(72) Inventors: Tae Joo Park, Ansan-si (KR); Ji Won Han, Suwon-si (KR)

(73) Assignee: INDUSTRY-UNIVERSITY COOPERATION FOUNDATION HANYANG UNIVERSITY ERICA CAMPUS, Ansan-Si (KR)

( * ) Notice: Subject to any disclaimer, the term of this patent is extended or adjusted under 35 U.S.C. 154(b) by 260 days.

(21) Appl. No.: 17/645,077

(22) Filed: Dec. 20, 2021

(65) Prior Publication Data

US 2022/0145466 A1 May 12, 2022

Related U.S. Application Data

(63) Continuation of application No. PCT/KR2020/008055, filed on Jun. 22, 2020.

(30) Foreign Application Priority Data

Jun. 21, 2019 (KR) .................. 10-2019-0074068

(51) Int. Cl.
 *C23C 16/56* (2006.01)
 *C23C 16/34* (2006.01)
 (Continued)

(52) U.S. Cl.
 CPC .............. *C23C 16/56* (2013.01); *C23C 16/34* (2013.01); *C23C 16/405* (2013.01);
 (Continued)

(58) Field of Classification Search
 None
 See application file for complete search history.

(56) References Cited

U.S. PATENT DOCUMENTS

| 5,817,367 A | 10/1998 | Chun et al. |
| 6,630,201 B2 | 10/2003 | Chiang et al. |
| (Continued) | | |

FOREIGN PATENT DOCUMENTS

| JP | 09-293692 A | 11/1997 |
| JP | 2009-097037 A | 5/2009 |
| (Continued) | | |

OTHER PUBLICATIONS

T. Faraz et al., "Tuning Material Properties of Oxides and Nitrides by Substrate Biasing during Plasma-Enhanced Atomic Layer Deposition on Planar and 3D Substrate Topographies", ACS Applied Materials and Interfaces vol. 10, pp. 13158-13180. (Year: 2018).*

(Continued)

*Primary Examiner* — Jiong-Ping Lu
(74) *Attorney, Agent, or Firm* — Finch & Maloney PLLC

(57) ABSTRACT

A material layer manufacturing method is provided. The material layer manufacturing method may comprise the steps of: preparing a substrate having a base pattern formed thereon; providing a first precursor on the substrate having the base pattern formed thereon, in a state where a first voltage is applied to the base pattern; and providing a second precursor on the substrate having the first precursor provided thereon, in a state where a second voltage is applied to the base pattern, to form, on the substrate having the base pattern formed thereon, a material layer resulting from the reaction of the first precursor with the second precursor.

9 Claims, 30 Drawing Sheets

(51) Int. Cl.
*C23C 16/40* (2006.01)
*C23C 16/455* (2006.01)
*H01L 21/02* (2006.01)
*H01L 21/033* (2006.01)
*H01L 21/3105* (2006.01)
*H01L 21/311* (2006.01)

(52) U.S. Cl.
CPC .. *C23C 16/45523* (2013.01); *C23C 16/45525* (2013.01); *C23C 16/45534* (2013.01); *H01L 21/02271* (2013.01); *H01L 21/0228* (2013.01); *H01L 21/0337* (2013.01); *H01L 21/02181* (2013.01); *H01L 21/02186* (2013.01); *H01L 21/31055* (2013.01); *H01L 21/31122* (2013.01)

(56) References Cited

U.S. PATENT DOCUMENTS

| | | | |
|---|---|---|---|
| 9,399,826 B2 | 7/2016 | Heo et al. | |
| 10,312,055 B2 | 6/2019 | Suzuki | |
| 10,340,135 B2 | 7/2019 | Blanquart | |
| 10,395,916 B2 | 8/2019 | Wu et al. | |
| 2009/0117723 A1* | 5/2009 | Kim | H01L 21/31122 438/669 |
| 2019/0385902 A1* | 12/2019 | Wang | H01L 21/823431 |

FOREIGN PATENT DOCUMENTS

| | | |
|---|---|---|
| KR | 10-2014-0105157 A | 9/2014 |
| KR | 10-2015-0131893 A | 11/2015 |
| KR | 10-2016-0097424 A | 8/2016 |
| KR | 10-2018-0060983 A | 6/2018 |
| KR | 10-2019-0012097 A | 2/2019 |
| KR | 10-2019-0041024 A | 4/2019 |

OTHER PUBLICATIONS

International Search Report for International Application No. PCT/KR2020/008055 dated Sep. 24, 2020, 2 pages.
Written Opinion of the International Searching Authority for International Application No. PCT/KR2020/008055 dated Sep. 24, 2020, 5 pages.

* cited by examiner

METHOD FOR SELECTIVELY MANUFACTURING MATERIAL LAYER AND TARGET PATTERN

TECHNICAL FIELD

The present invention relates to a method of selectively manufacturing a material layer and a target pattern, and more specifically, to a method of selectively manufacturing a material layer and a target pattern in which the material layer is etched after manufactured by reacting a first precursor with a second precursor on a base pattern.

BACKGROUND ART

As device structures become more complex and process miniaturizations proceed to increase the degree of integration of semiconductor devices, the top-down approach, which has been widely used in the conventional processes, for cutting out bulk-state materials is facing physical limitations. Accordingly, the bottom-up approach for fabricating devices by laminating materials through assembling atoms or molecules is necessary.

In particular, among the bottom-up approaches, studies related to a selective lamination method capable of manufacturing a lamination structure only in a desired area are being actively conducted. For example, Korean Unexamined Patent Publication No. 10-2019-0041024 (Application No.: 10-2019-7010195, Applicant: Applied Materials, Incorporated) discloses a method of selectively depositing a layer, in which the method includes the steps of providing a substrate having a first surface and a second surface different from the first surface; exposing the substrate to a pre-clean plasma including at least one of argon or hydrogen in order to form a pre-cleaned substrate; and selectively depositing a metal layer on the first surface of the pre-cleaned substrate relative to the second surface. Further, various studies on a method of selectively depositing a layer are continuously being conducted.

DISCLOSURE

Technical Problem

One technical problem to be solved by the present invention is to provide to selectively deposit a thin layer in a specific area a method of selectively manufacturing a material layer and a target pattern.

Another technical problem to be solved by the present invention is to provide a method of selectively manufacturing a material layer and a target pattern to solve a problem of slowing a growth rate due to repetition of a process cycle.

Still another technical problem to be solved by the present invention is to provide a method of selectively manufacturing a material layer and a target pattern to have the improved process efficiency and the reduced process time.

The technical problems to be solved by the present invention are not limited to the above description.

Technical Solution

In order to solve the above technical problems, the present invention provides a method of manufacturing a material layer.

According to one embodiment, the method of manufacturing the material layer includes: preparing a substrate on which a base pattern is formed; providing a first precursor onto the substrate on which the base pattern is formed while a first voltage is applied to the base pattern; and forming a material layer formed by reacting the first precursor with the second precursor on the substrate on which the base pattern is famed, by providing a second precursor onto the substrate to which the first precursor is provided while a second voltage is applied to the base pattern, wherein a deposition rate of the material layer deposited on the base pattern and a deposition rate of the material layer deposited on the substrate exposed between the base patterns are different from each other.

According to one embodiment, the method of manufacturing the material layer may include controlling the deposition rate of the material layer deposited on the base pattern and the deposition rate of the material layer deposited on the substrate exposed between the base patterns by controlling the first voltage and the second voltage.

According to one embodiment, the deposition rate of the material layer deposited on the base pattern may be lower than the deposition rate of the material layer deposited on the substrate exposed between the base patterns, and a thickness of the material layer deposited on the base pattern may be smaller than a thickness of the material layer deposited on the substrate exposed between the base patterns.

According to one embodiment, the deposition rate of the material layer deposited on the base pattern may be higher than the deposition rate of the material layer deposited on the substrate exposed between the base patterns, and a thickness of the material layer deposited on the base pattern may be greater than the thickness of the material layer deposited on the substrate exposed between the base patterns.

In order to solve the above technical problems, the present invention provides a method of manufacturing a target pattern.

According to one embodiment, the method of manufacturing the target pattern further includes, after the forming of the material layer in the method of manufacturing the material layer according to the embodiment, forming a target pattern on the base pattern by providing an etching source on the substrate on which the material layer is formed, wherein the etching source etches the material layer deposited on the base pattern and the material layer deposited on the substrate exposed between the base patterns, so that the material layer deposited on the base pattern remains and the material layer deposited on the substrate exposed between the base patterns is removed, and the target pattern is defined by the material layer remaining on the base pattern.

According to one embodiment, in the method of manufacturing the target pattern, the first precursor providing step, the second precursor providing step, and the etching source providing step may be defined as a unit process, and the unit process may be repeatedly performed.

According to one embodiment, as the number of repetitions of the unit process is increased, magnitudes of the first voltage and the second voltage applied to the base pattern may be increased.

According to one embodiment, as the number of repetitions of the unit process is increased, time for providing the first precursor and time for providing the second precursor may be increased.

According to one embodiment, in the method of manufacturing the target pattern, a density of the target pattern may be increased when the first voltage and the second voltage are applied to the base pattern.

According to one embodiment, a resistivity of the target pattern may be decreased when the first voltage and the second voltage are applied to the base pattern.

According to another embodiment, the method of manufacturing the target pattern may include: preparing a substrate on which a base pattern is formed; forming a material layer covering the base pattern and the substrate exposed between the base patterns by reacting the first and second precursors on the substrate on which the base pattern is formed, in which a thickness of the material layer formed on the base pattern is greater than a thickness of the material layer famed on the substrate exposed between the base patterns; and etching the material layer formed on the base pattern and the material layer formed on the substrate exposed between the base patterns, so that the material layer deposited on the base pattern remains and the material layer deposited on the substrate exposed between the base patterns is removed, thereby forming a target pattern on the base pattern.

According to another embodiment, the forming of the material layer may include: providing the first precursor onto the substrate on which the base pattern is formed while a first voltage is applied to the base pattern; and providing the second precursor onto the substrate to which the first precursor is provided while a second voltage is applied to the base pattern.

According to another embodiment, the forming of the target pattern may include: providing an etching source onto the substrate on which the material layer is formed while a third voltage is applied to the base pattern.

Advantageous Effects

The method of manufacturing the material layer according to the embodiment of the present invention includes: preparing a substrate on which a base pattern is formed; providing the first precursor onto the substrate on which the base pattern is formed while a first voltage is applied to the base pattern; and forming a material layer formed by reacting the first precursor with the second precursor on the substrate on which the base pattern is formed, by providing a second precursor onto the substrate to which the first precursor is provided while a second voltage is applied to the base pattern, wherein a deposition rate of the material layer deposited on the base pattern and a deposition rate of the material layer deposited on the substrate exposed between the base patterns are different from each other. Thus, a method of manufacturing a material layer having a different thickness for each area can be provided.

The method of manufacturing the target pattern according to the embodiment of the present invention includes: preparing the substrate on which the base pattern is formed; forming the material layer covering the base pattern and the substrate exposed between the base patterns by reacting the first and second precursors on the substrate on which the base pattern is formed; and forming the target pattern on the base pattern by etching the material layer formed on the base pattern and the material layer formed on the substrate exposed between the base patterns.

In addition, according to the method of manufacturing the target pattern of the embodiment, a thickness of the material layer formed on the base pattern in the step of forming the material layer may be greater than the thickness of the material layer formed on the substrate exposed between the base patterns. In addition, as the material layer is etched in the step of forming the target pattern, the material layer deposited on the base pattern may remain, and the material layer deposited on the substrate exposed between the base patterns may be removed. Thus, a method capable of selectively forming a pattern in a specific area on a substrate can be provided.

BEST MODE

Mode for Invention

Hereinafter, exemplary embodiments of the present invention will be described in detail with reference to the accompanying drawings. However, the technical idea of the present invention is not limited to the exemplary embodiments described herein and may be embodied in other forms. Further, the embodiments are provided to enable contents disclosed herein to be thorough and complete and provided to enable those skilled in the art to fully understand the idea of the present invention.

In the specification herein, when one component is mentioned as being on the other component, it signifies that the one component may be placed directly on the other component or a third component may be interposed therebetween. In addition, in drawings, thicknesses of layers and areas may be exaggerated to effectively describe the technology of the present invention.

In addition, the terms such as first, second, and third are used to describe various components in various embodiments of the present specification, however, the components will not be limited by the terms. The above terms are used merely to distinguish one component from another. Accordingly, a first component referred to in one embodiment may be referred to as a second component in another embodiment. Each embodiment described and illustrated herein may also include a complementary embodiment. In addition, the term "and/or" is used herein to include at least one of the components listed before and after the term.

The singular expression herein includes a plural expression unless the context clearly specifies otherwise. In addition, it will be understood that the term such as "include" or "have" herein is intended to designate the presence of feature, number, step, component, or a combination thereof recited in the specification, and does not preclude the possibility of the presence or addition of one or more other features, numbers, steps, components, or combinations thereof. In addition, the term "connection" is used herein to include both indirectly connecting a plurality of components and directly connecting the components.

In addition, in the following description of the embodiments of the present invention, the detailed description of known functions and configurations incorporated herein will be omitted when it possibly makes the subject matter of the present invention unclear unnecessarily.

Figure 1:
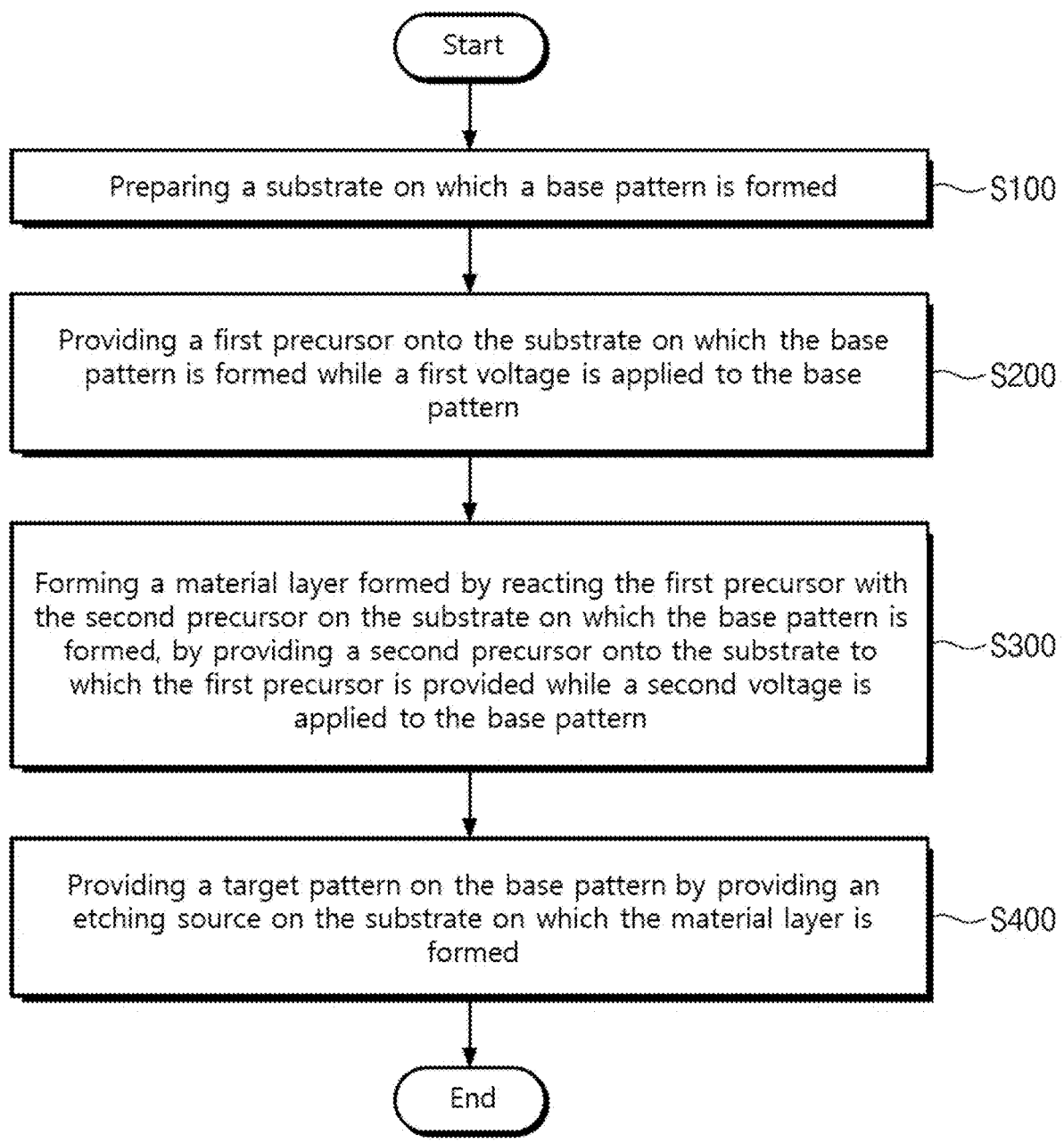
FIG. 1 is a flowchart explaining a method of manufacturing a material layer and a target pattern according to the embodiment of the present invention.
Figure 2:
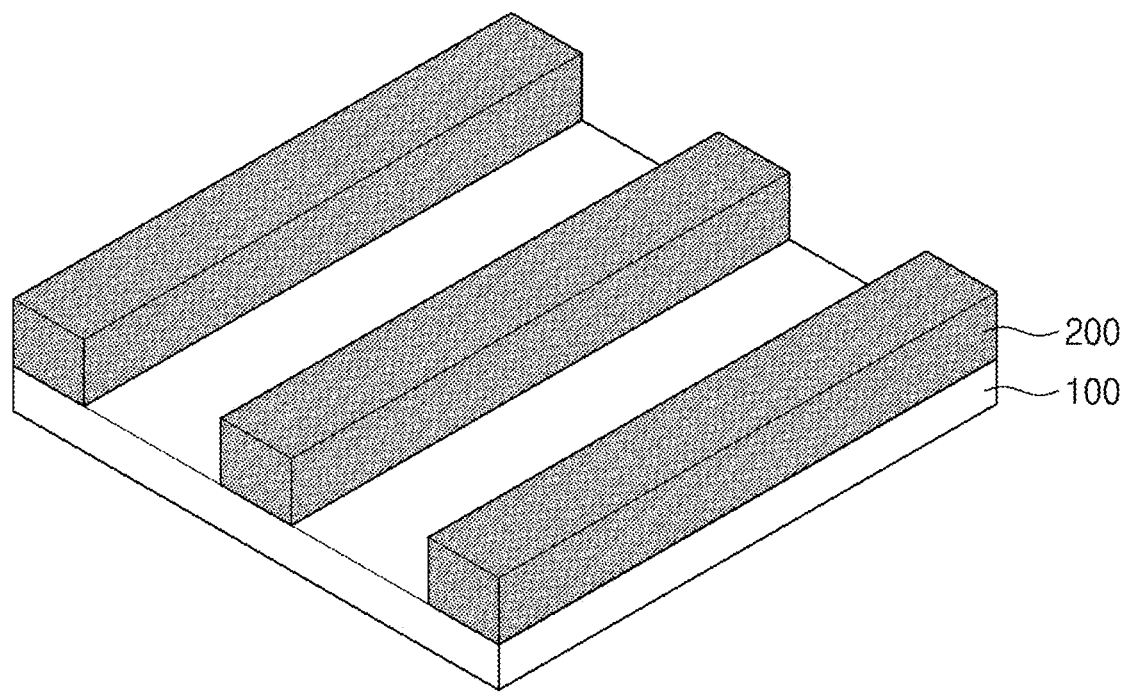
FIGS. 2 to 4 are views showing a manufacturing process of the material layer according to the embodiment of the present invention.
Figure 3:
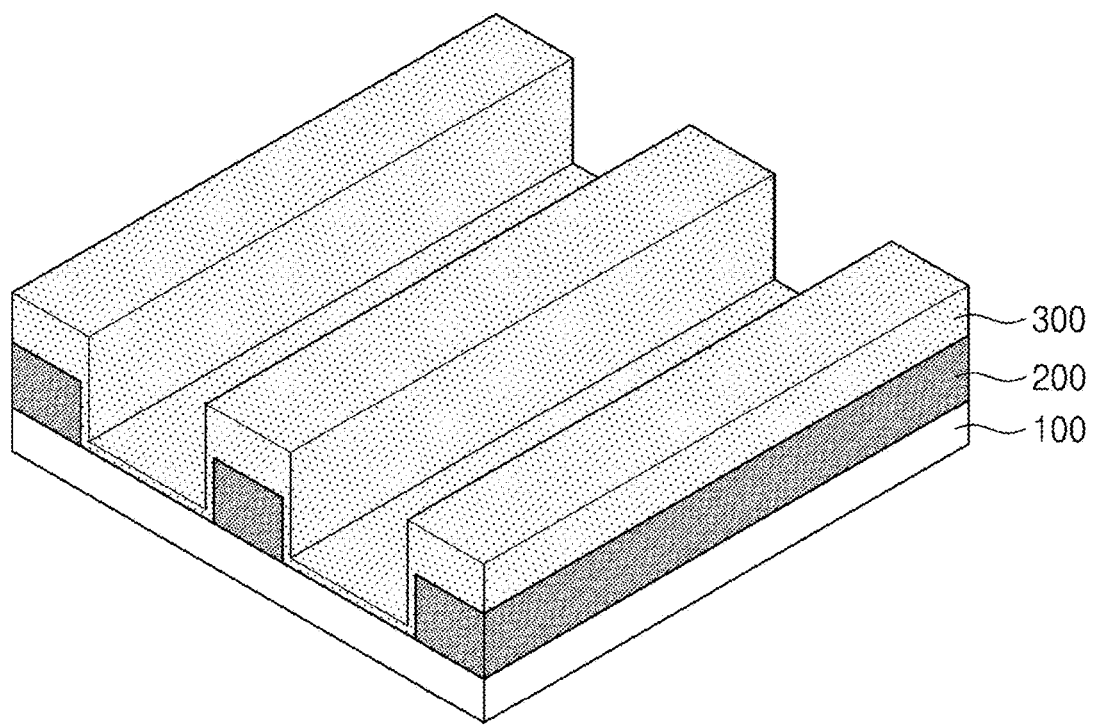
Figure 4:
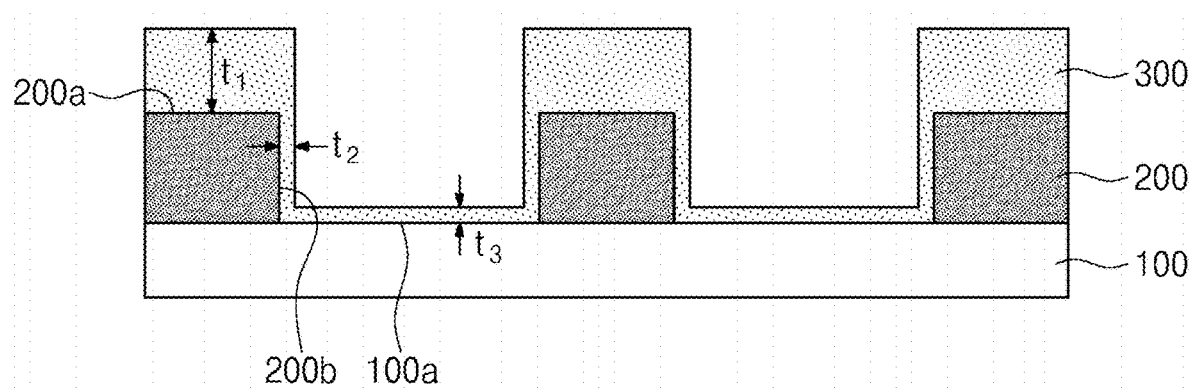
Figure 5:
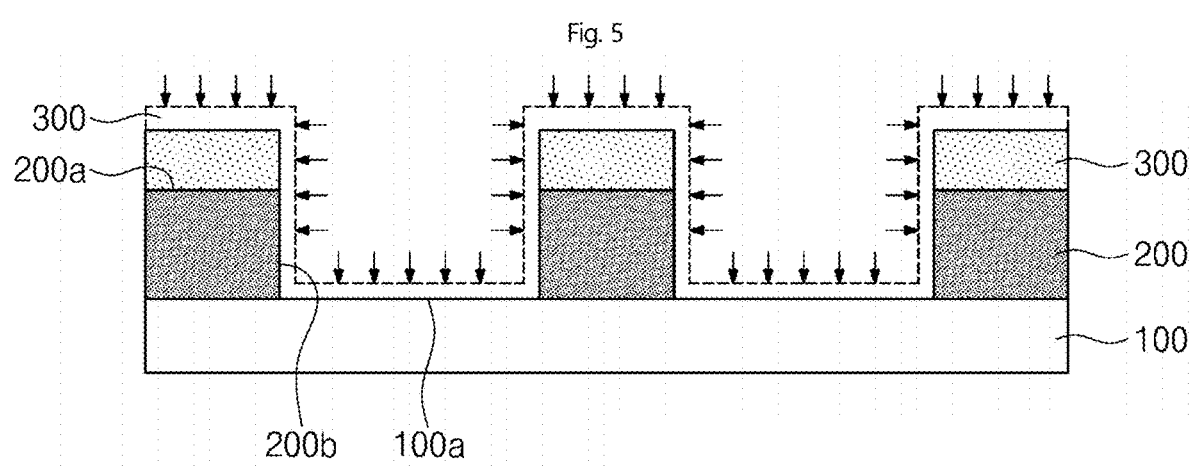
FIGS. 5 and 6 are views showing a manufacturing process of the target pattern according to the embodiment of the present invention.
Figure 6:
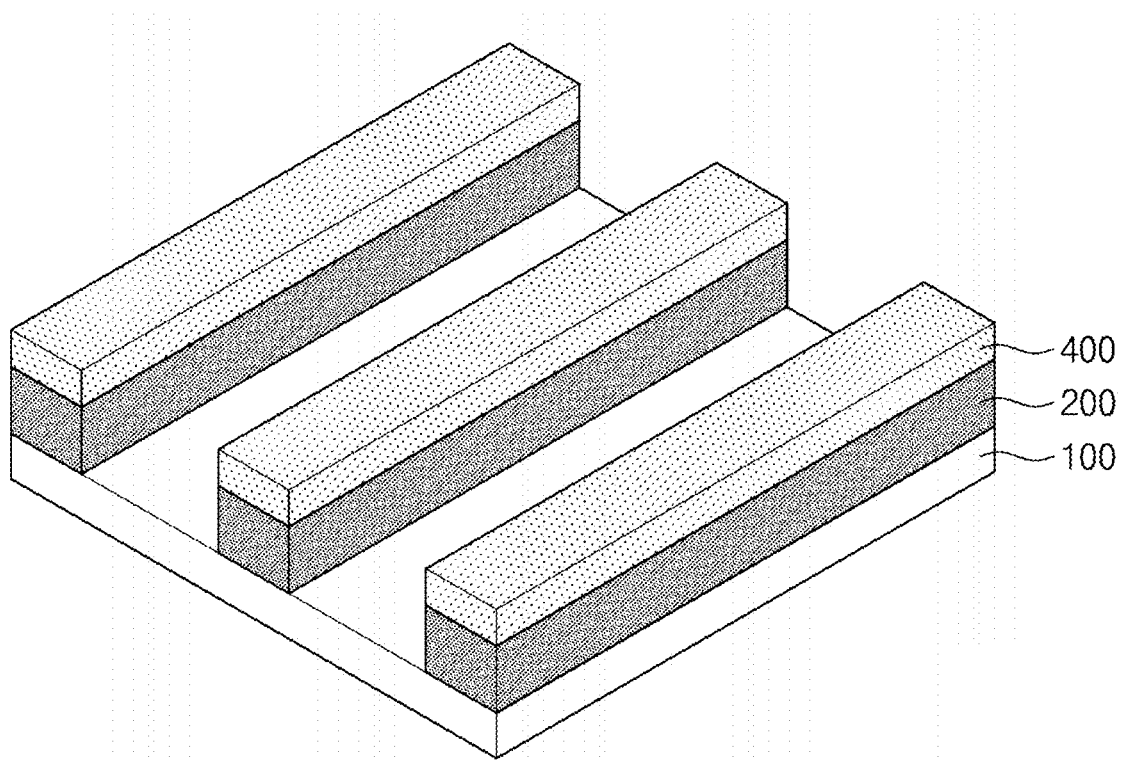
Figure 7:
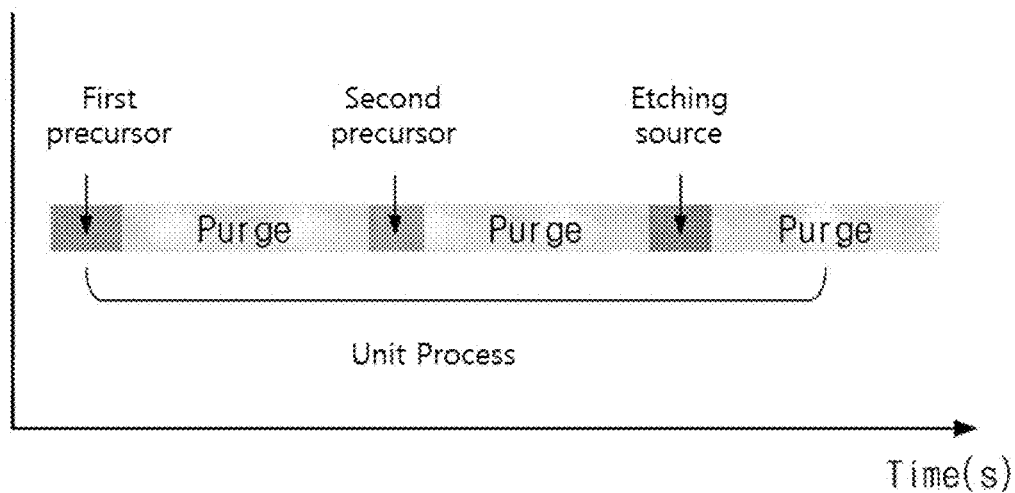
FIGS. 7 and 8 are views showing a unit process during the manufacturing process of the target pattern according to the embodiment of the present invention.
Figure 8:
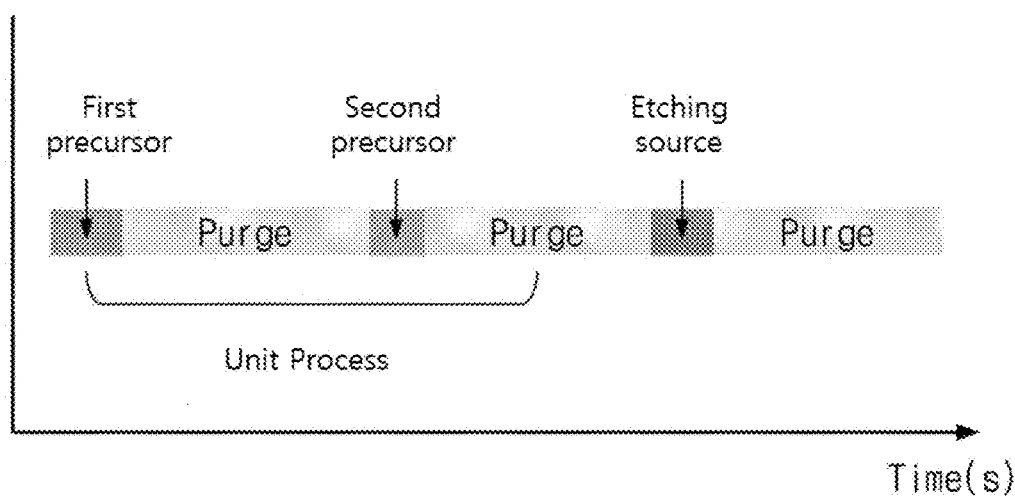

FIG. 1 a flowchart explaining a manufacturing method of a material layer and a target pattern according to the embodiment of the present invention. FIGS. 2 to 4 are views showing a manufacturing process of a material layer according to the embodiment of the present invention. FIGS. 5 and 6 are views showing a manufacturing process of a target pattern according to the embodiment of the present invention. FIGS. 7 and 8 are views showing a unit process of the manufacturing process of the target pattern according to the embodiment of the present invention.

Referring to FIGS. 1 to 4, a substrate 100 formed thereon with a base pattern 200 may be prepared (S100). According to one embodiment, the step of preparing the substrate 100 formed thereon with the base pattern 200 may include: preparing the substrate 100; and forming the base pattern 200 on the substrate 100. For example, the substrate 100 may be any one of a silicon semiconductor substrate, a compound semiconductor substrate, a glass substrate, or a plastic substrate. For example, the base pattern 200 may include metal. In other words, the base pattern 200 may be a metal pattern.

An insulating layer (not shown) may be disposed between the substrate 100 and the base pattern 200. For example, the insulating layer may be formed of various materials, such as silicon oxide, silicon nitride, or silicon oxynitride, having insulating properties.

In a state in which a first voltage is applied to the base pattern 200, a first precursor may be provided on the substrate 100 on which the base pattern 200 is formed. In other words, after the first voltage is provided to the base pattern 200, the first precursor may be provided on the substrate 100 on which the base pattern 200 is formed. For example, the first precursor may include Tetrakis-dimethyl-amido-titanium (TDMATi), ethyl-benzene ethyl-1,4-cyclohexadiene ruthenium (EBECHRu) and the like.

According to one embodiment, when the first precursor is provided while the first voltage is applied to the base pattern 200, the first precursor may be mainly adsorbed onto a surface of the base pattern 200. In other words, the first precursor may be adsorbed onto the surface of the base pattern 200 more than onto a surface 100*a* of the substrate 100 exposed between the base patterns 200. In addition, according to one embodiment, the first precursor may be adsorbed onto an upper surface 200*a* of the base pattern 200 more than on a side surface 200*b* of the base pattern 200.

After the first precursor is provided, inert gas may be provided on the substrate 100 to which the first precursor is provided. For example, the inert gas may be nitrogen (N2) gas. In other words, after the first precursor is provided, a purge process may be performed.

After the purge process, and while a second voltage is applied to the base pattern 200, a second precursor may be provided on the substrate 100 to which the first precursor is provided. In other words, after the second voltage is applied to the base pattern 200, the second precursor may be provided on the substrate 100 to which the first precursor is provided. For example, the second precursor may include O2, NH3, H2O, and the like.

According to one embodiment, when the second precursor is provided while the second voltage is applied to the base pattern 200, the second precursor may mainly react with the first precursor on the surface of the base pattern 200. In other words, the second precursor may react more with the first precursor on the surface of the base pattern 200 compared to the surface 100a of the substrate 100 exposed between the base patterns 200. In addition, according to one embodiment, the second precursor may react more with the first precursor on the upper surface 200a of the base pattern 200 compared to the side surface 200b of the base pattern 200.

After the second precursor is provided, inert gas may be provided on the substrate 100 to which the second precursor is provided. For example, the inert gas may be nitrogen (N2) gas. In other words, after the second precursor is provided, a purge process may be performed.

The first precursor and the second precursor may be reacted to form a material layer 300 (S300). More specifically, the material layer 300 may cover the base pattern 200. In addition, the material layer 300 may cover the exposed substrate 100 between the base patterns 200.

As described above, during forming the material layer 300, the first precursor and the second precursor may be provided in a state in which the first voltage and the second voltage are applied to the base pattern 200. In this case, a deposition rate of the material layer 300 deposited on the base pattern 200 and a deposition rate of the material layer 300 deposited on the substrate 100a exposed between the base patterns 200 may be different from each other.

In addition, when the first voltage and the second voltage are applied to the base pattern 200, a potential difference may be generated between the base pattern 200 and the substrate 100a exposed between the base patterns 200. In this case, the deposition rate of the material layer 300 deposited on the base pattern 200 and the deposition rate of the material layer 300 deposited on the substrate 100a exposed between the base patterns 200 may be different from each other.

More specifically, the deposition rate of the material layer 300 deposited on the base pattern 200 may be higher than the deposition rate of the material layer 300 deposited on the substrate 100a exposed between the base patterns 200. Accordingly, a thickness t1 of the material layer 300 deposited on the base pattern 200 may be greater than a thickness t3 of the material layer 300 deposited on the substrate 100a exposed between the base patterns 200. In addition, as described above, the first and second precursors may be adsorbed onto the upper surface 200a of the base pattern 200 more than onto the side surface 200b of the base pattern 200. Accordingly, the thickness t1 of the material layer 300 formed on the base pattern 200 may be greater than a thickness t2 of the material layer 300 famed on the side surface 200b of the base pattern 200.

In other words, during forming the material layer 300, the first voltage and the second voltage applied to the base pattern 200 may be controlled, so that the deposition rate of the material layer 300 deposited on the base pattern 200 and the deposition rate of the material layer 300 deposited on the substrate 100a exposed between the base patterns 200 may be controlled.

Referring to FIGS. 1, 5 and 6, the material layer 300 may be etched to form a target pattern 400 (S400). According to one embodiment, the step of forming the target pattern 400 may include: etching the material layer 300 by providing an etching source on the substrate 100 on which the material layer 300 is formed; and providing inert gas on the etched material layer 300. For example, the inert gas may be nitrogen (N2) gas. In other words, after the material layer 300 is etched, a purge process may be performed.

More specifically, the etching source may etch the material layer 300 on the upper surface 200a of the base pattern, the material layer 300 on the side surface 200b of the base pattern, and the material layer 300 on the substrate 100a exposed between the base patterns 200.

According to one embodiment, the material layer 300 on the upper surface 200a of the base pattern, the material layer 300 on the side surface 200b of the base pattern, and the material layer 300 on the substrate 100a exposed between the base patterns 200 may be etched at the same etching rate.

In addition, as described above, the thickness t1 of the material layer 300 on the upper surface 200a of the base pattern may be greater than the thickness t2 of the material layer 300 on the side surface 200b of the base pattern and the thickness t3 of the material layer 300 on the substrate 100a exposed between the base patterns 200.

Accordingly, the material layer 300 on the upper surface 200a of the base pattern may remain, however, the material layer 300 on the side surface of the base pattern 200b and the material layer 300 on the substrate 100a exposed between the base pattern 200 may be removed. The material layer 300 remaining on the upper surface 200a of the base pattern may be defined as the target pattern 400.

In other words, the method of manufacturing the material layer according to the embodiment of the present invention can selectively form the target pattern 400 in a specific area on the substrate 100. Accordingly, a method of manufacturing a material layer having a different thickness for each area can be provided.

According to one embodiment, when the target pattern 400 is formed while the first and second voltages are applied to the base pattern 200, physical, chemical, and electrical properties of the target pattern 400 may be controlled. For example, when the target pattern 400 is formed while the first and second voltages are applied to the base pattern 200, the density of the target pattern 400 may be increased and the resistivity may be decreased.

According to one embodiment, as shown in FIG. 7, the first precursor providing step, a purge step, the second precursor providing step, a purge step, the etching source providing step, and a purge step may be defined as a unit process. In addition, the unit process may be repeatedly performed. In this case, as described later, a problem of lowering the growth rate of the target pattern 400 may occur.

According to another embodiment, as shown in FIG. 8, the first precursor providing step, a purge step, the second precursor providing step, and a purge step may be defined as a unit process. In addition, the unit process may be repeatedly performed. After the unit process is repeatedly performed, the etching source providing step, and the purge step may be performed. In other words, after the steps of providing the first precursor and the second precursor are performed multiple times, the etching step may be performed.

According to another embodiment, the process shown in FIG. 8 may be performed during an initial process cycle, and the process shown in FIG. 7 may be performed during a later process cycle. In other words, a first deposition process may be performed multiple times during the initial process cycle, in which "the first precursor providing step—the purge step—the second precursor providing step—the purge step" are performed multiple times and then the etching source providing step and the purge step are performed. Thereafter, a second deposition process may be performed multiple times during the later process cycle, in which "the first precursor providing step—the purge step—the second precursor providing step—the purge step—the etching source providing step—the purge step" are performed. Accordingly, the material layer 400 may be rapidly formed with a uniform thickness on the base pattern 200. In other words, the thickness of the material layer 300 may be thin or the deposition rate on the base pattern 200 may be relatively high due to an influence of a field by the voltage applied to the base pattern 200 during an initial deposition process. However, when the thickness of the material layer 300 is increased as the process cycle is performed, the deposition rate on the base pattern 200 may be relatively decreased due to a decrease in the influence of the field by the voltage applied to the base pattern 200. However, as in the embodiment of the present invention, the thickness of the material layer 300 may be rapidly increased by the first deposition process during the initial process cycle in which the material layer 300 is absent or the material layer 300 is thin, and the selective deposition characteristic of the material layer 300 may be improved by the second deposition process during the later process cycle in which the material layer 300 is thick. As a result, a high-quality selective thin layer deposition method having a uniform thickness as well as saving process cost and process time can be provided.

According to one embodiment, the magnitudes of the first voltage and the second voltage applied to the base pattern 200 may be controlled based on the number of repetitions of the unit process. Specifically, as the number of repetitions of the unit process is increased, the magnitudes of the first voltage and the second voltage applied to the base pattern 200 may be increased. In this case, the problem of lowering the growth rate of the target pattern 400 due to the increased number of repetitions of the unit process can be solved.

As described above, when the number of repetitions of the unit process is increased, the thickness of the target pattern 400 may be increased. In this case, the influence of the field by the first and second voltages applied to the base pattern 200 may be reduced. Accordingly, amounts of the first precursor adsorbed onto the base pattern 200 and the second precursor reacted with the first precursor may be relatively reduced. As a result, when the number of repetitions of the unit process is increased, a problem in that a process time for forming the target pattern 400 is increased may occur.

However, when the magnitudes of the first and second voltages applied to the base pattern 200 are increased as the number of repetitions of the unit process is increased, the influence of the field by the first and second voltages applied to the base pattern 200 may be maintained. Thus, the problem of decreasing the growth rate of the target pattern 400 formed on the base pattern 200 can be solved. As a result, the problem of increasing the process time of forming the target pattern 400 due to the repeated execution of the unit process can be solved.

In addition, as the number of repetitions of the unit process is increased, the time for providing the first precursor and the time for providing the second precursor applied to the base pattern 200 may be increased. In this case, the influence of the field by the first and second voltages applied to the base pattern 200 may be maintained. Thus, the problem of decreasing the growth rate of the target pattern 400 formed on the base pattern 200 can be solved. As a result, the problem of increasing the process time of forming the target pattern 400 due to the repeated execution of the unit process can be solved.

In addition, according to one embodiment, in the step of providing the etching source on the substrate 100 on which the material layer 300 is formed, a third voltage may be applied to the base pattern 200. Accordingly, the thickness of the target pattern 400 formed on the base pattern 200 may be uniform.

As described above, in the process of forming the material layer 300, the first voltage and the second voltage may be applied to the base pattern 200. The influence of the field by the first voltage and the second voltage may be focused on an edge of the base pattern 200. Accordingly, substantially, a thickness of one area of the material layer 300 adjacent to the edge of the base pattern 200 may be relatively thicker than other areas. In this case, as described above, when the third voltage is applied to the base pattern 200 in the step of providing the etching source, the influence of the field by the third voltage may be focused on the edge of the base pattern 200, and accordingly, the one area of the material layer 300 adjacent to the edge of the base pattern 200 having the relatively thick thickness may be etched more than other areas. Accordingly, the target pattern 400 having a uniform thickness may be easily manufactured.

The method of manufacturing the target pattern according to the embodiment of the present invention may include: preparing the substrate 100 on which the base pattern 200 is formed; forming the material layer 300 covering the base pattern 200 and the substrate 100 exposed between the base patterns 200, by reacting the first and second precursors on the substrate 100 on which the base pattern 200 is formed; and forming the target pattern 400 on the base pattern 200, by etching the material layer 300 famed on the base pattern 200 and the material layer 300 formed on the substrate 100 exposed between the base patterns 200.

In addition, according to the method of manufacturing the target pattern of the embodiment, in the step of forming the material layer 300, the thickness of the material layer 300 formed on the base pattern 200 may be greater than the thickness of the material layer formed on the substrate exposed between the base patterns 200. In addition, as the material layer 300 is etched in the step of forming the target pattern 300, the material layer 300 deposited on the base pattern 200 may remain, and the material layer 300 deposited on the substrate 100 exposed between the base patterns 200 may be removed. Accordingly, the method capable of selectively forming a pattern in a specific area on a substrate may be provided.

As described above, based on FIGS. 1 to 6 and the description referring thereto, the material layer 300 is deposited on the upper surface 200*a* of the base pattern 200 relatively thickly, and deposited on the substrate 100*a* exposed between the side surface 200*b* of the base pattern 200 and the base pattern 200 relatively thinly. Thereafter, the etching process is performed, so that the target pattern 400 is formed on the upper surface 200*a* of the base pattern 200.

According to one modification unlike the above description, depending on types of the precursor used for deposition of the material layer 300 and polarities of the voltage applied to the base pattern 200, the material layer 300 may be deposited on the upper surface 200*a* of the base pattern 200 and the side surface 200*b* of the base pattern 200 relatively thinly, and may be deposited on the substrate 100*a* exposed between the base patterns 200 relatively thickly. Further, in this case, it will be apparent to those skilled in the art that the etching process is performed after the material layer 300 is deposited, so that the target pattern 400 may be formed on the substrate 100*a* exposed between the base patterns 200.

Hereinafter, a manufacturing method of a material layer and a target pattern according to the modification of the present invention will be described.

Figure 9:
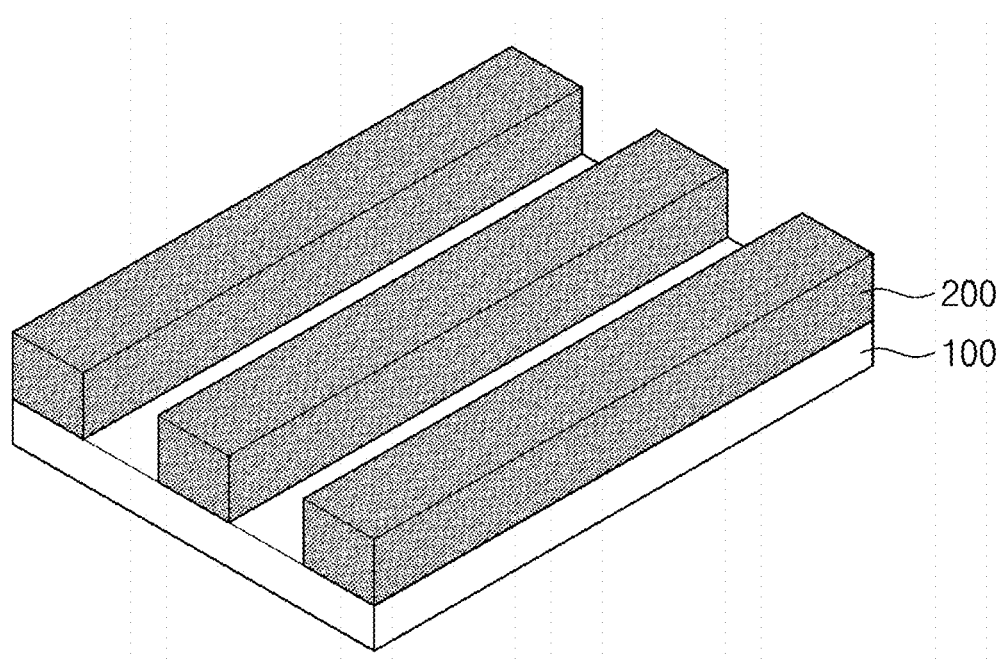
FIGS. 9 to 11 are views showing a manufacturing process of a material layer according to the modification of the present invention.
Figure 10:
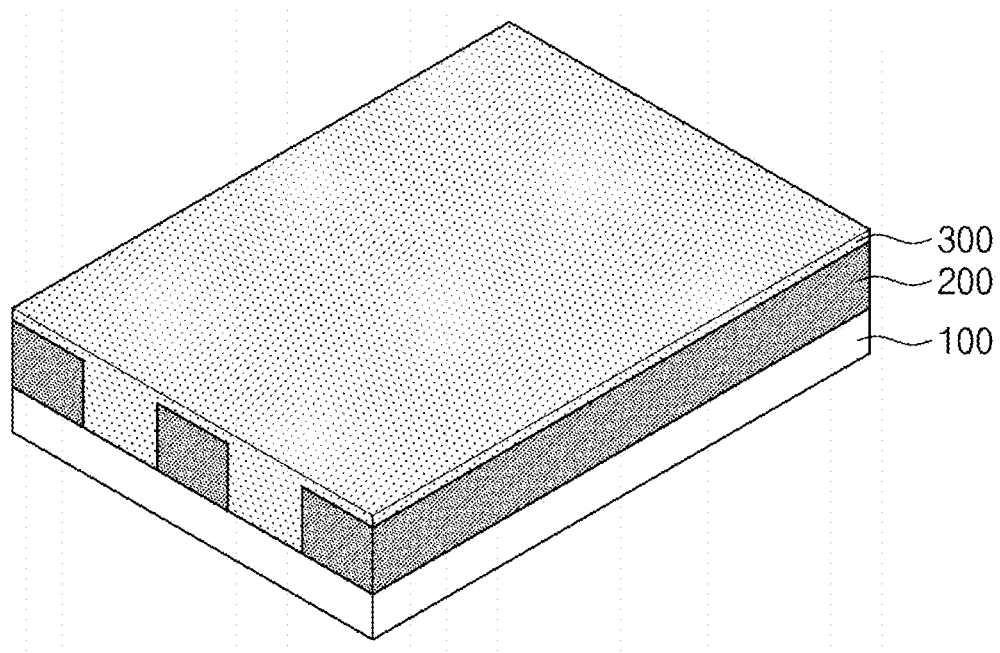
Figure 11:
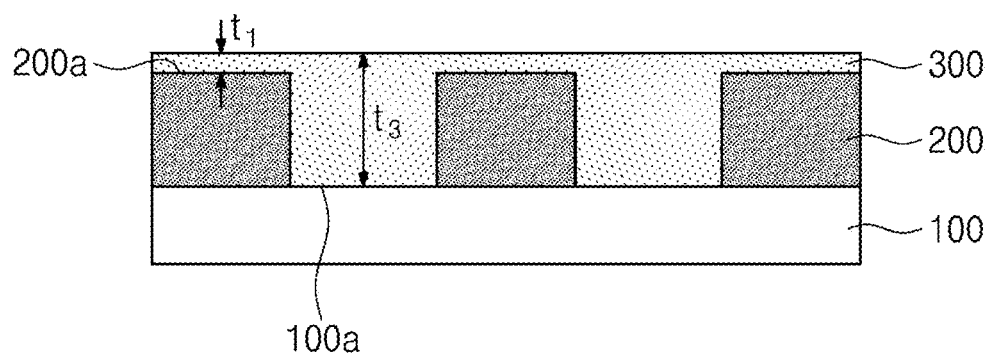
Figure 12:
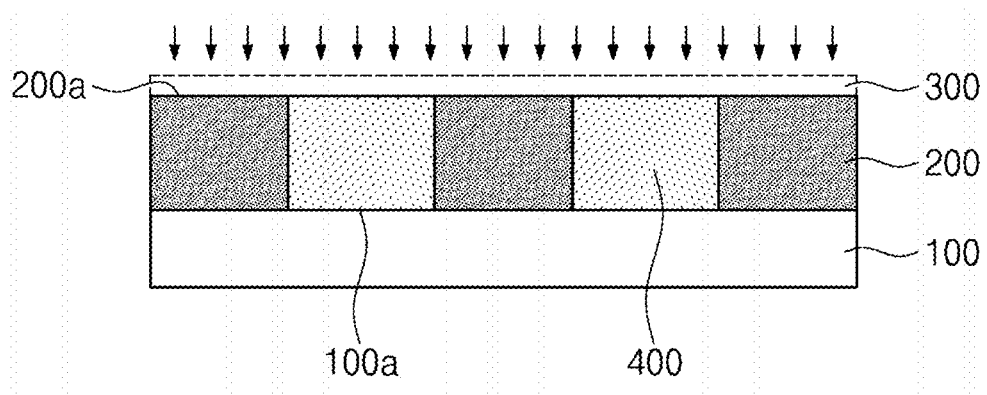
FIGS. 12 and 13 are views showing a manufacturing process of a target pattern according to the modification of the present invention.
Figure 13:
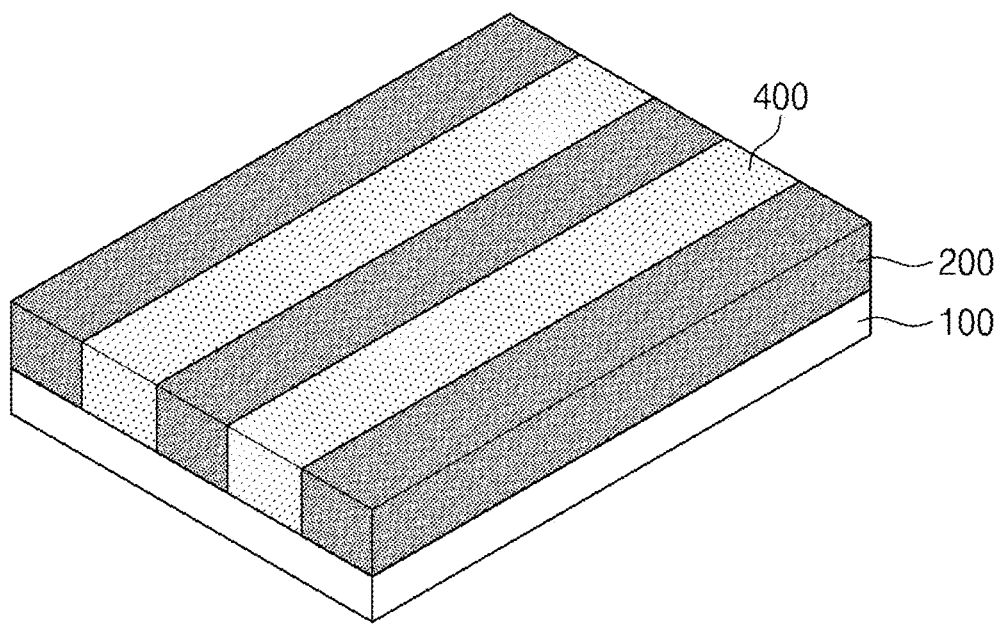

FIGS. 9 to 11 are views showing a manufacturing process of the material layer according to the modification of the present invention. FIGS. 12 and 13 are views showing a manufacturing process of the target pattern according to the modification of the present invention.

Referring to FIGS. 9 to 11, a substrate 100 on which a base pattern 200 is formed may be prepared. According to one embodiment, the step of preparing the substrate 100 formed thereon with the base pattern 200 may include: preparing the substrate 100; and forming the base pattern 200 on the substrate 100. For example, the substrate 100 may be any one of a silicon semiconductor substrate, a compound semiconductor substrate, a glass substrate, or a plastic substrate. For example, the base pattern 200 may include metal. In other words, the base pattern 200 may be a metal pattern.

An insulating layer (not shown) may be disposed between the substrate 100 and the base pattern 200. For example, the insulating layer may be formed of various materials, such as silicon oxide, silicon nitride, or silicon oxynitride, having insulating properties.

In a state in which a first voltage is applied to the base pattern 200, a first precursor may be provided on the substrate 100 on which the base pattern 200 is formed. In other words, after the first voltage is provided to the base pattern 200, the first precursor may be provided on the substrate 100 on which the base pattern 200 is formed. For example, the first precursor may include Tetrakis(dimethylamido)titanium (TDMATi), ethyl-benzene ethyl-1,4-cyclohexadiene ruthenium (EBECHRu), and the like.

According to one embodiment, when the first precursor is provided on the base pattern 200 while the first voltage is applied, the first precursor may be mainly adsorbed onto the surface 100a of the substrate exposed between the base patterns 200. Specifically, the base pattern 200 to which the first voltage is applied may be reduced in binding force with the first precursor. Accordingly, the first precursor having failed to be coupled to the base pattern 200 may be coupled to the exposed substrate 100 between the base patterns 200. As a result, the first precursor may be adsorbed relatively largely onto the surface of the substrate 100 exposed between the base patterns 200, compared with the base pattern 200.

After the first precursor is provided, inert gas may be provided on the substrate 100 to which the first precursor is provided. For example, the inert gas may be nitrogen (N2) gas. In other words, after the first precursor is provided, a purge process may be performed.

After the purge process, and while a second voltage is applied to the base pattern 200, a second precursor may be provided on the substrate 100 to which the first precursor is provided. In other words, after the second voltage is applied to the base pattern 200, the second precursor may be provided on the substrate 100 to which the first precursor is provided. For example, the second precursor may include O2, NH3, H2O, and the like.

According to one embodiment, when the second precursor is provided while the second voltage is applied to the base pattern 200, the second precursor may mainly react with the first precursor on the surface of the base pattern 200. In other words, in the surface 100a of the substrate 100 exposed between the base patterns 200, the second precursor may be reacted on the surface of the base pattern 200 compared with the first precursor.

After the second precursor is provided, inert gas may be provided on the substrate 100 to which the second precursor is provided. For example, the inert gas may be nitrogen (N2) gas. In other words, after the second precursor is provided, a purge process may be performed.

The first precursor and the second precursor may be reacted to form a material layer 300. More specifically, the material layer 300 may cover the base pattern 200. In addition, the material layer 300 may cover the exposed substrate 100 between the base patterns 200.

As described above, during forming the material layer 300, the first precursor and the second precursor may be provided in a state in which the first voltage and the second voltage are applied to the base pattern 200. In this case, a deposition rate of the material layer 300 deposited on the base pattern 200 and a deposition rate of the material layer 300 deposited on the substrate 100a exposed between the base patterns 200 may be different from each other.

In addition, when the first voltage and the second voltage are applied to the base pattern 200, a potential difference may be generated between the base pattern 200 and the substrate 100a exposed between the base patterns 200. In this case, the deposition rate of the material layer 300 deposited on the base pattern 200 and the deposition rate of the material layer 300 deposited on the substrate 100a exposed between the base patterns 200 may be different from each other.

More specifically, the deposition rate of the material layer 300 deposited on the base pattern 200 may be lower than the deposition rate of the material layer 300 deposited on the substrate 100a exposed between the base patterns 200. Accordingly, a thickness t1 of the material layer 300 deposited on the base pattern 200 may be smaller than a thickness t3 of the material layer 300 deposited on the substrate 100a exposed between the base patterns 200.

Referring to FIGS. 12 and 13, the material layer 300 may be etched to form the target pattern 400. According to one embodiment, the step of forming the target pattern 400 may include: etching the material layer 300 by providing an etching source on the substrate 100 on which the material layer 300 is formed; and providing inert gas on the etched material layer 300. For example, the inert gas may be nitrogen (N2) gas. In other words, after the material layer 300 is etched, a purge process may be performed.

More specifically, the etching source may etch the material layer 300 deposited on the base pattern 200, and the material layer 300 deposited on the substrate 100a exposed between the base patterns 200. According to one embodiment, the material layer 300 deposited on the base pattern 200, and the material layer 300 deposited on the substrate 100a exposed between the base patterns 200 may be etched at the same etching rate.

In addition, as described above, the thickness t3 of the material layer 300 deposited on the substrate 100a exposed between the base patterns 200 may be greater than the thickness t1 of the material layer 300 deposited on the base pattern 200.

Accordingly, the material layer 300 deposited on the exposed substrate 100a between the base patterns 200 may remain. Whereas, the material layer 300 deposited on the base pattern 200 may be removed. In this case, the material layer 300 deposited on the exposed substrate 100a between the base patterns 200 may be defined as the target pattern 400. In other words, the target pattern 400 may be selectively formed on the substrate 100a exposed between the base patterns 200.

In addition, according to one embodiment as described above, the first precursor providing step, a purge step, the second precursor providing step, a purge step, the etching source providing step, and a purge step may be defined as a unit process. In addition, the unit process may be repeatedly performed.

In addition, according to another embodiment as described above, the first precursor providing step, a purge step, the second precursor providing step, and a purge step may be defined as a unit process. In addition, the unit process may be repeatedly performed. After the unit process is repeatedly performed, the etching source providing step, and the purge step may be performed. In other words, after the steps of providing the first precursor and the second precursor are performed multiple times, the etching step may be performed.

In addition, according to another embodiment as described above, the process shown in FIG. 8 may be performed during an initial process cycle, and the process shown in FIG. 7 may be performed during a later process cycle. In other words, a first deposition process may be performed multiple times during the initial process cycle, in which "the first precursor providing step—the purge step—the second precursor providing step—the purge step" are performed multiple times and then the etching source providing step and the purge step are performed.

Thereafter, a second deposition process may be performed multiple times during the later process cycle, in which "the first precursor providing step—the purge step—the second precursor providing step—the purge step—the etching source providing step—the purge step" are performed.

In addition, according to one embodiment, the magnitudes of the first voltage and the second voltage applied to the base pattern 200 may be controlled based on the number of repetitions of the unit process. Specifically, as the number of repetitions of the unit process is increased, the magnitudes of the first voltage and the second voltage applied to the base pattern 200 may be increased. Alternatively, according to one embodiment, as the number of repetitions of the unit process is increased, the time for providing the first precursor and the time for providing the second precursor applied to the base pattern 200 may be increased.

In addition, as described above, the influence of the field by the first voltage and the second voltage applied to the base pattern 200 in the process of forming the material layer 300 may be focused on the edge of the base pattern 200. Accordingly, the thickness of one area of the material layer 300 substantially adjacent to the edge of the base pattern 200 may be relatively thinner than other areas. In this case, when a third voltage is applied to the base pattern 200 in the step of providing the etching source, the influence of the field by the third voltage may be focused on the edge of the base pattern 200, and accordingly, the one area of the material layer 300 having the relatively thin thickness may be etched less than other areas. Accordingly, the roughness and surface characteristics of the upper surface of the target pattern 400 can be improved.

The method of selectively manufacturing a material layer and a target pattern according to the embodiments and the modifications of the present invention has been described. Hereinafter, results on specific experimental examples and characteristic evaluations will be described with respect to the method of selectively manufacturing the material layer and the target pattern according to the above embodiments and modifications.

Manufacture of Material Layer According to Experimental Example 1

After providing Tetrakis-dimethylamido-titanium (TDMATi) heated to 55° C. to a substrate at a temperature of 250° C., $N_2$ gas was provided at 200 sccm and purged. Thereafter, after providing $NH_3$ gas at 1500 sccm to the substrate, $N_2$ gas was provided at 200 sccm and purged. After defining the TDMATi provision-purge-$NH_3$ provision-purge process as 1 cycle, the cycle was performed 50 cycles to manufacture a TiN thin layer having a thickness of 20 nm on the substrate, in which a voltage was applied to the substrate in the step of providing TDMATi and/or the step of providing $NH_3$.

Manufacture of Material Layer According to Experimental Example 2

Figure 23:
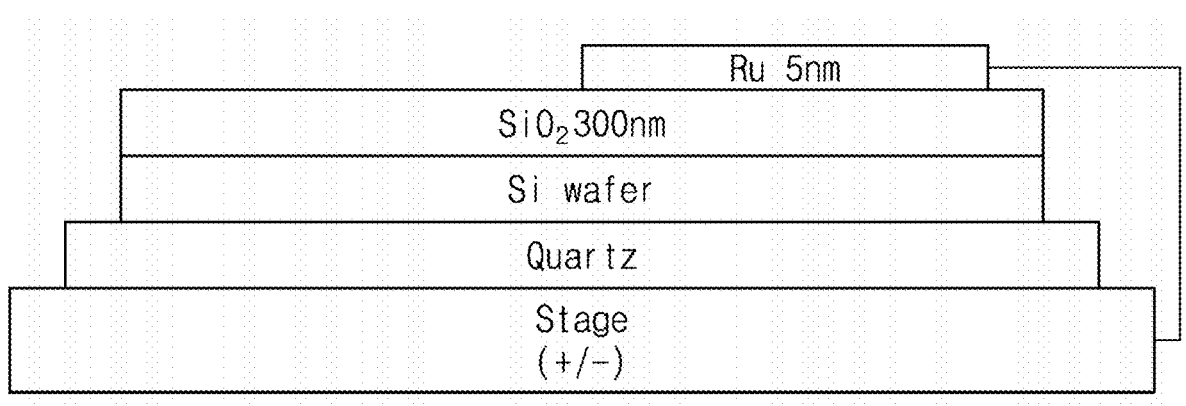
FIG. 23 is a view showing a deposition process of material layers according to Experimental Example 2 and Experimental Example 3 of the present invention.

A structure in which a stage at a temperature of 250° C., quartz, silicon (Si), silicon oxide ($SiO_2$) having a thickness of 300 nm, and ruthenium (Ru) having a thickness of 5 nm are sequentially laminated is prepared (see FIG. 23). After providing Tetrakis-dimethylamido-titanium (TDMATi) heated to 55° C. to the stage included in the prepared laminated structure, $N_2$ gas was provided at 200 sccm and purged. Thereafter, after providing $H_2O$ at a temperature of 10° C., $N_2$ gas was provided at 200 sccm and purged. After defining the TDMATi provision-purge-$H_2O$ provision-purge process as 1 cycle, the cycle was performed multiple times to manufacture a $TiO_2$ thin layer on the laminated structure, in which a voltage was applied to the ruthenium in the step of providing TDMATi.

Manufacture of Material Layer According to Experimental Example 3

Under the same conditions as in Experimental Example 2, an $HfO_2$ thin layer was manufactured on the laminated structure by using TEMAHf instead of TDMATi, in which a voltage was applied to the ruthenium in the step of providing TEMAHf.

Figure 14:
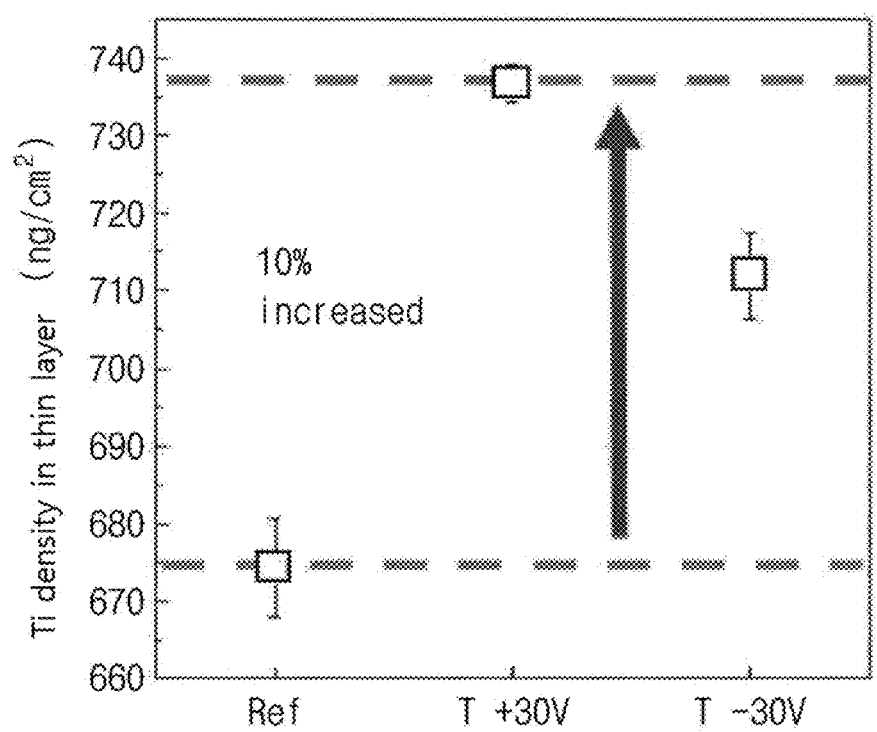
FIG. 14 is a graph showing changes in density of a material layer according to Experimental Example 1 of the present invention, based on the magnitude of a voltage ($\pm 30V$) applied during providing TDMATi.

FIG. 14 is a graph showing changes in density of a material layer according to Experimental Example 1 of the present invention based on the magnitude of a voltage (±30V) applied during providing TDMATi.

Referring to FIG. 14, the voltage applied to the substrate was controlled to +30V in the process of providing TDMATi without applying a voltage to the substrate in the step of providing $NH_3$, thereby depositing the material layer T+30V according to Experimental Example 1, the voltage applied to the substrate was controlled to −30V in the process of providing TDMATi without applying a voltage to the substrate in the step of providing $NH_3$, thereby depositing the material layer T−30V according to Experimental Example 1, and a material layer Ref was deposited to the substrate without applying a voltage. Changes in Ti density ($ng/cm^2$) in the material layer were measured and shown with respect to each of the material layer T+30V, the material layer T−30V, and the material layer Ref. As shown in FIG. 14, it can be seen that the material layer T+30V) according to Experimental Example 1 formed after applying a voltage of +30V showed a density increased by 10% compared to the material layer Ref deposited without applying the voltage, and had the Ti density higher than that of the material layer T−30V according to Experimental Example 1 formed after applying a voltage of −30V.

Figure 15:
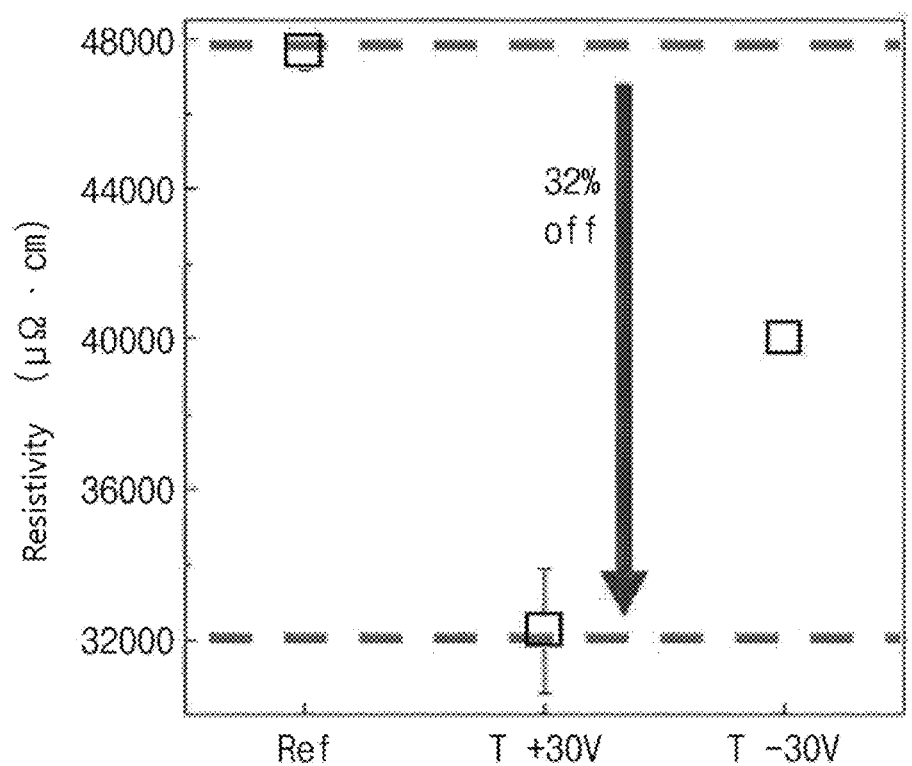
FIG. 15 is a graph showing changes in resistivity of the material layer according to Experimental Example 1 of the present invention, based on the magnitude of a voltage ($\pm 30V$) applied during providing TDMATi.

FIG. 15 is a graph showing changes in resistivity of the material layer according to Experimental Example 1 of the present invention based on the magnitude of a voltage (±30V) applied during providing TDMATi.

Referring to FIG. 15, Changes in resistivity ($\mu\Omega$ cm) in the material layer were measured and shown with respect to each of the material layer T+30V, the material layer T−30V, and the material layer Ref according to Experimental Example 1 described with reference to FIG. 14. As shown in FIG. 15, it can be seen that the material layer T+30V according to Experimental Example 1 formed after applying a voltage of +30V showed a resistivity decreased by 32% compared to the material layer Ref deposited without applying the voltage, and had the resistivity lower than that of the material layer T−30V according to Experimental Example 1 formed after applying a voltage of −30V.

Figure 16:
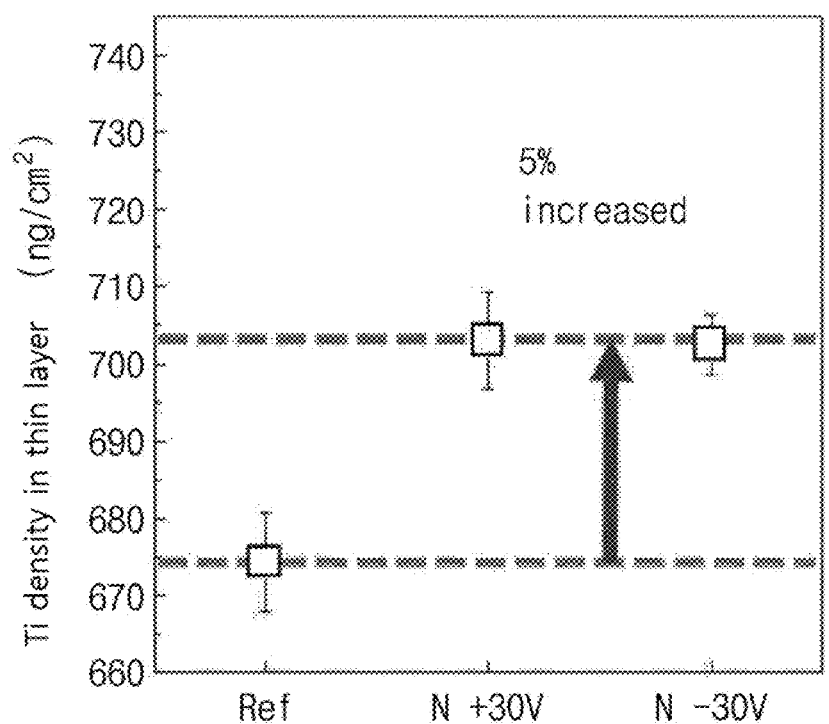
FIG. 16 is a graph showing changes in density of a material layer according to Experimental Example 1 of the present invention, based on the magnitude of a voltage ($\pm 30V$) applied during providing $NH_3$.

FIG. 16 is a graph showing changes in density of a material layer according to Experimental Example 1 of the present invention based on the magnitude of a voltage (±30V) applied during providing NH3.

Referring to FIG. 16, the voltage applied to the substrate was controlled to +30V in the process of providing NH3 without applying a voltage to the substrate in the step of providing TDMATi, thereby depositing the material layer N+30V according to Experimental Example 1, the voltage applied to the substrate was controlled to −30V in the process of providing NH3 without applying a voltage to the substrate in the step of providing TDMATi, thereby depositing the material layer N−30V according to Experimental Example 1, and a material layer Ref was deposited to the substrate without applying a voltage. Changes in Ti density (ng/cm2) in the material layer were measured and shown with respect to each of the material layer N+30V, the material layer N−30V, and the material layer Ref. As shown in FIG. 16, it can be seen that the material layer N+30V and the material layer N−30V according to Experimental Example 1 formed after applying voltages of +30V and −30V showed a density increased by 5% compared to the material layer Ref deposited without applying the voltage. In addition, it can be seen that the Ti densities in the material layer N+30V and the material layer N−30V had similar values.

Figure 17:
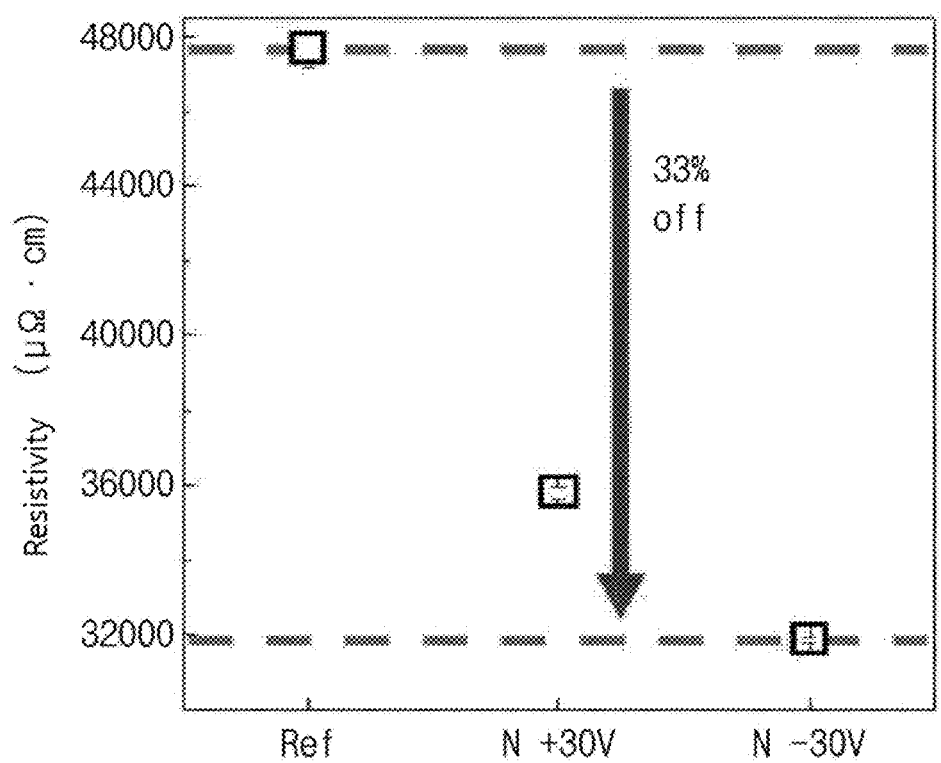
FIG. 17 is a graph showing changes in resistivity of the material layer according to Experimental Example 1 of the present invention, based on the magnitude of a voltage ($\pm 30V$) applied during providing $NH_3$.

FIG. 17 is a graph showing changes in resistivity of the material layer according to Experimental Example 1 of the present invention based on the magnitude of a voltage (±30V) applied during providing NH3.

Referring to FIG. 17, changes in resistivity (μΩ cm) in the material layer were measured and shown with respect to each of the material layer N+30V, the material layer N−30V, and the material layer Ref according to Experimental Example 1 described with reference to FIG. 16. As shown in FIG. 17, it can be seen that the material layer N−30V according to Experimental Example 1 formed after applying a voltage of −30V showed a resistivity decreased by 33% compared to the material layer Ref deposited without applying the voltage, and had the resistivity lower than that of the material layer N+30V according to Experimental Example 1 formed after applying a voltage of +30V.

Figure 18:
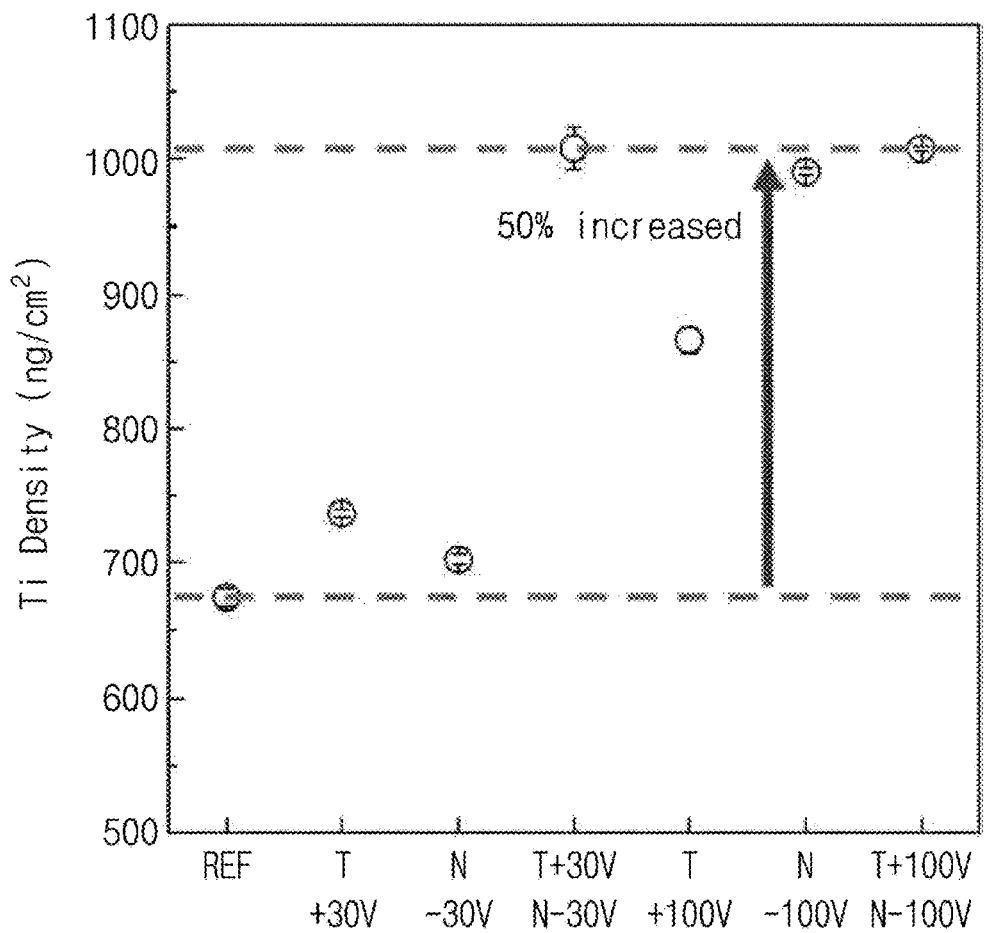
FIG. 18 is a graph showing changes in density of a material layer according to Experimental Example 1 of the present invention, based on the magnitude of a voltage ($\pm 30$, $\pm 100$) applied during providing TDMATi and providing $NH_3$.

FIG. 18 is a graph showing changes in density of a material layer according to Experimental Example 1 of the present invention based on the magnitude of a voltage (±30, ±100) applied during providing TDMATi and providing NH3.

referring to FIG. 18, +30V was applied to the substrate in the step of providing TDMATi and −30V was applied to the substrate in the step of providing NH3, thereby depositing the material layer T+30V N−30V according to Experimental Example 1, +100V was applied to the substrate in the step of providing TDMATi without applying a voltage to the substrate in the step of providing NH3, thereby depositing the material layer T+100V according to Experimental Example 1, −100V was applied to the substrate in the step of providing NH3 without applying a voltage to the substrate in the step of providing TDMATi, thereby depositing the material layer N−100V according to Experimental Example 1, and +100V was applied to the substrate in the step of providing TDMATi and −100V was applied to the substrate in the step of providing NH3, thereby depositing the material layer T+100V N−100V according to Experimental Example 1.

Thereafter, changes in Ti density (ng/cm2) in the material layer were measured and shown with respect to each of the material layer Ref, the material layer T+30V, the material layer N−30V, the material layer T+30V N−30V, the material layer T+100V, the material layer N−100V, the material layer T+100V N−100V as described with reference to FIGS. 14 and 16d.

As shown in FIG. 18, it can be seen that the material layer T+100V had the Ti density in the thin layer is higher than the material layer T+30V. In addition, it can be seen that the material layer N−100V had the Ti density in the thin layer is higher than the material layer N−30V.

However, it can be seen that the material layer T+30V N−30V formed after applying +30V and −30V to the substrate in the steps of TDMATi and NH3, respectively had the density in the thin layer higher than that of the material layer T+100V formed after applying a relatively high voltage (+100V) to the substrate in the step of providing TDMATi, and had substantially the same Ti density as the material layer N−100V formed after applying a relatively high voltage (−100V) to the substrate in the step of providing NH3, and the material layer T+100V N−100V formed after applying relatively high voltages (+100V, −100V) to the substrate in the steps of providing TDMATi and NH3.

In other words, it can be seen that, although the metal content in the thin layer may be increased by increasing the magnitude of the voltage applied to the substrate, the application of a high level voltage (+ voltage) and a low level voltage (− voltage) in the steps of providing the first precursor and the second precursor, respectively is an efficient approach to significantly improve the density of metal in a thin layer with a low voltage, compared to the increase of the metal content in the thin layer by increasing the magnitude of the voltage.

Figure 19:
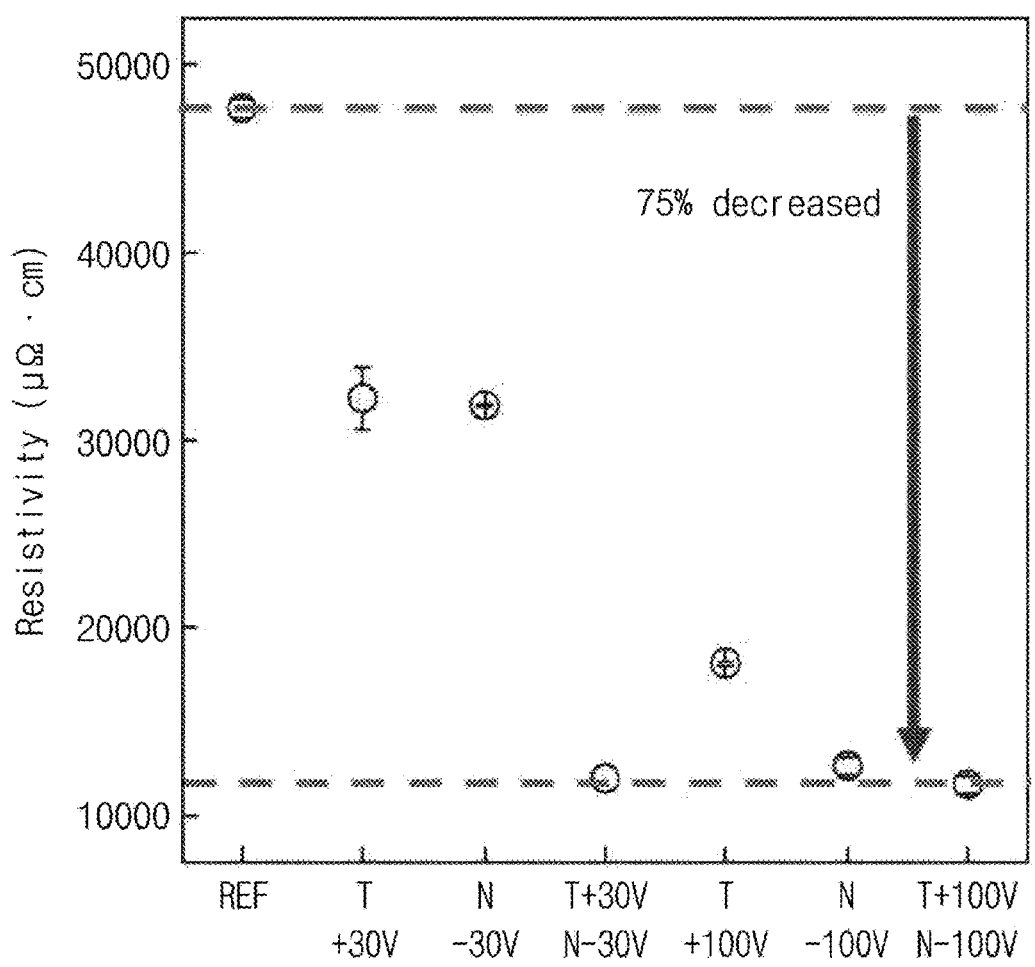
FIG. 19 is a graph showing changes in resistivity of the material layer according to Experimental Example 1 of the present invention, based on the magnitude of a voltage ($\pm 30$, $\pm 100$) applied during providing TDMATi and providing $NH_3$.

FIG. 19 is a graph showing changes in resistivity of the material layer according to Experimental Example 1 of the present invention based on the magnitude of a voltage (±30, ±100) applied during providing TDMATi and providing NH3.

Referring to FIG. 19, changes in resistivity (μΩ cm) in the material layer were measured and shown with respect to each of the material layer Ref, the material layer T+30V, the material layer N−30V, the material layer T+30V N−30V, the material layer T+100V, the material layer N−100V, and the material layer T+100V N−100V described with reference to FIG. 18.

As shown in FIG. 19, it can be seen that the material layer T+100V had the resistivity of the thin layer lower than the material layer T+30V. In addition, it can be seen that the material layer N−100V had the resistivity of the thin layer lower than the material layer N−30V.

However, it can be seen that the material layer T+30V N−30V formed after applying +30V and −30V to the substrate in the steps of TDMATi and NH3, respectively had the resistivity of the thin layer lower than that of the material layer T+100V formed after applying a relatively high voltage (+100V) to the substrate in the step of providing TDMATi, and had substantially the same resistivity as the material layer N−100V formed after applying a relatively high voltage (−100V) to the substrate in the step of providing NH3, and the material layer T+100V N−100V formed after applying relatively high voltages (+100V, −100V) to the substrate in the steps of providing TDMATi and NH3.

In other words, it can be seen that, although the resistivity of the thin layer may be decreased by increasing the magnitude of the voltage applied to the substrate, the application of a high level voltage (+ voltage) and a low level voltage (− voltage) in the steps of providing the first precursor and the second precursor, respectively is an efficient approach to significantly improve the density of metal in a thin layer with a low voltage, compared to the decrease of the resistivity of the thin layer by increasing the magnitude of the voltage.

Figure 20:
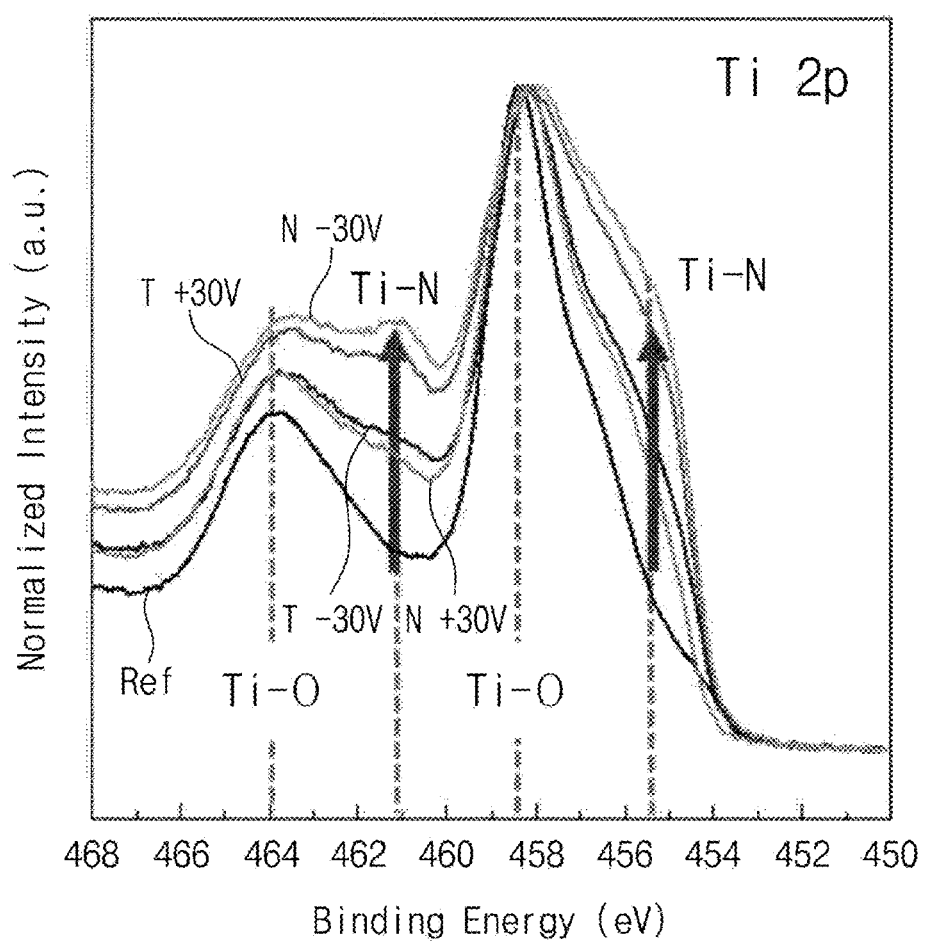
FIGS. 20 to 22 are graphs showing changes in chemical properties of a material layer according to Experimental Example 1 of the present invention.
Figure 21:
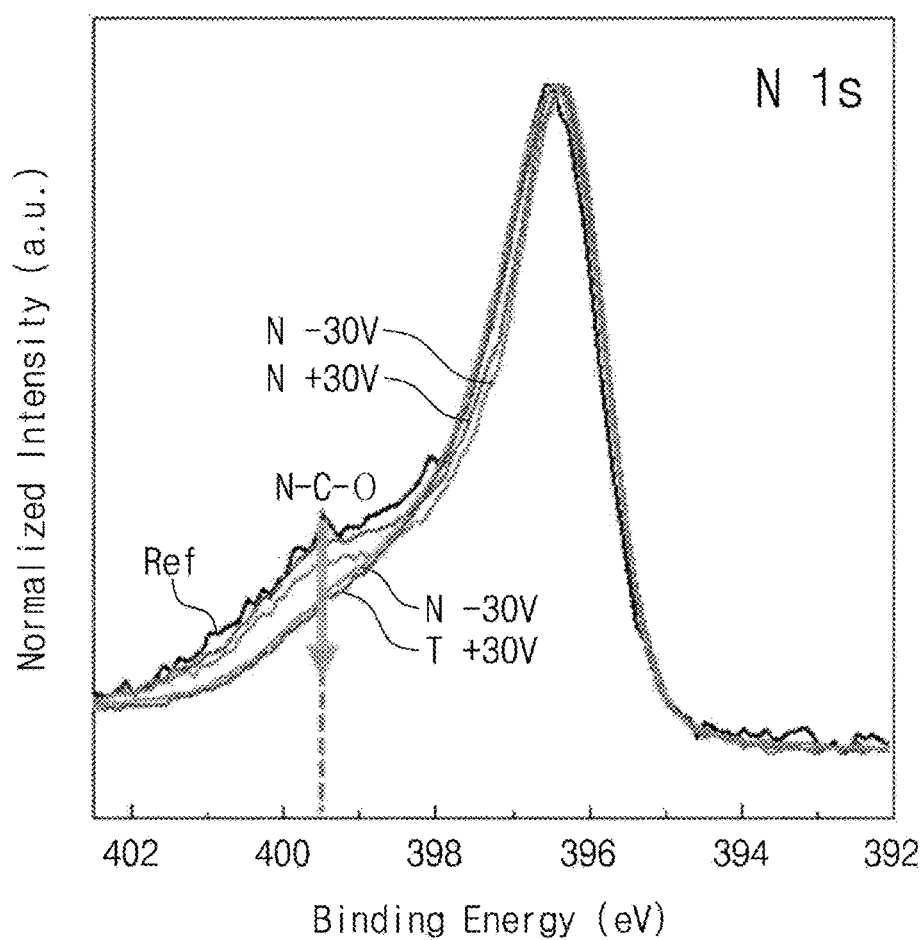
Figure 22:
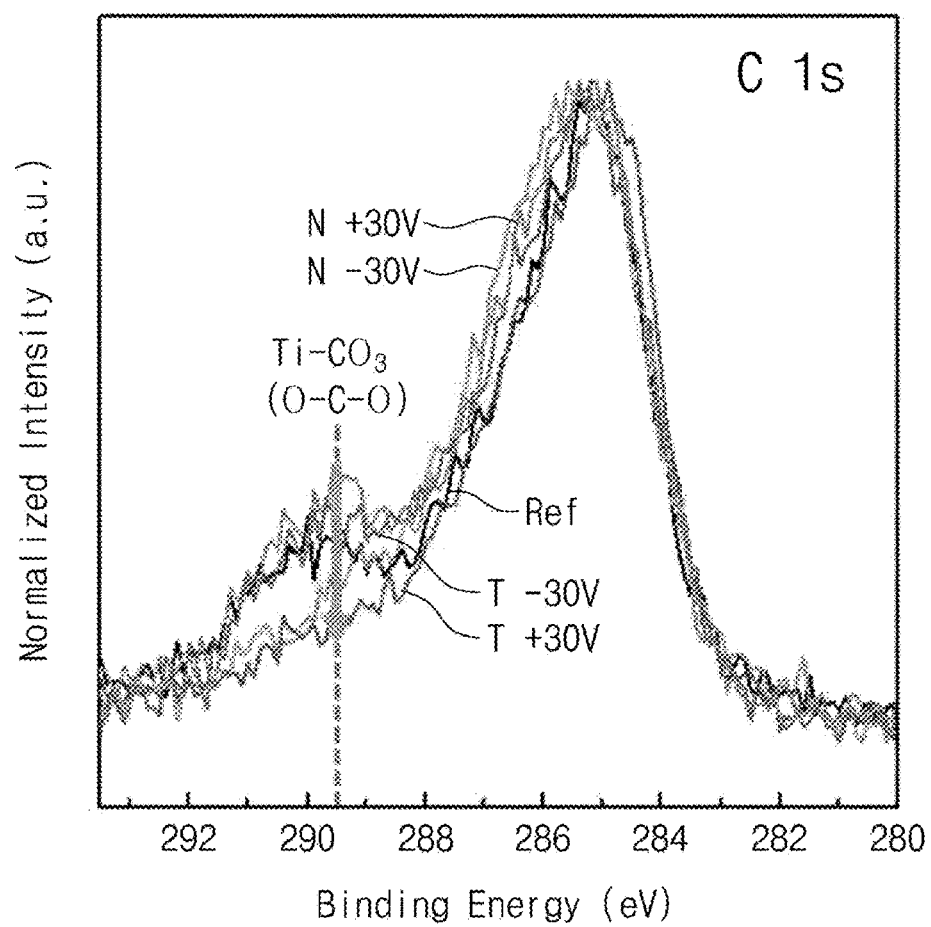

FIGS. 20 to 22 are graphs showing changes in chemical properties of the material layer according to Experimental Example 1 of the present invention.

Referring to FIGS. 20 to 22, an XPS analysis was performed with respect to the material layer Ref, the material layer T+30V, the material layer T−30V, the material layer N+30V, and the material layer N−30V described with reference to FIGS. 14 and 16. FIG. 20 is a Ti 2p spectrum, FIG. 21 is an N 1s spectrum, and FIG. 22 is a C 1s spectrum.

As shown in FIG. 20, it can be seen that, compared to the material layer Ref applied with no voltage to the substrate, Ti—N binding was increased with respect to Ti—O binding when a voltage was applied to the substrate. Specifically, it can be seen that the Ti—N binding was sequentially increased in the order of the material layer N+30V, the material layer T−30V, the material layer T+30V, and the material layer N−30V.

As shown in FIG. 21, it can be seen that N—C—O coupling was decreased when a voltage was applied to the substrate, compared to the material layer Ref applied with no voltage to the substrate. In other words, it can be seen that, when the voltage was applied to the substrate during the deposition process, the amount of impurities in the material layer deposited on the substrate was decreased.

In addition, as shown in FIG. 22, it can be seen that Ti—CO3 coupling was decreased when a voltage was applied to the substrate, compared to the material layer Ref applied with no voltage to the substrate. In other words, it can be seen that, when the voltage was applied to the substrate during the deposition process, the amount of impurities in the material layer deposited on the substrate was decreased.

In conclusion, as shown in FIGS. 21 to 23, it can be seen that the material layer according to Experimental Example 1 had improved chemical properties.

FIG. 23 is a view showing a deposition process of material layers according to Experimental Example 2 and Experimental Example 3 of the present invention.

Referring to FIG. 23, +100V or −100V was applied to ruthenium (Ru) in the steps of providing TDMATi and TEMAHf without applying a voltage to ruthenium (Ru) in the step of providing H2O, thereby depositing a TiO2 material layer T+100V, T−100V and an HfO2 material layer H+100V on the laminated structure, the TiO2 and HfO2 material layer Ref was deposited on the laminated structure without applying a voltage, and then the thickness of the deposited material layer was measured. Specifically, the thicknesses of the material layers deposited on ruthenium (Ru) and silicon oxide were measured as shown in Table 1 and Table 2 below.

TABLE 1

| Item | On SiO2 | On Ru |
|---|---|---|
| Ref | 4.8 nm | 4.8 nm |
| T + 100 V | 5 nm | 3.4 nm |
| T − 100 V | 5.3 nm | 4.2 nm |

TABLE 2

| Item | On SiO2 | On Ru |
|---|---|---|
| Ref | 5.8 nm | 6.0 nm |
| H + 100 V | 6.2 nm | 8.4 nm |

As shown in Table 1, when no voltage is applied to ruthenium (Ru), TiO2 material layers having the same thickness are deposited on SiO2 and ruthenium (Ru). However, it can be seen that, when +100V and −100V are applied to ruthenium (Ru) in the step of providing TDMATi, the thicknesses of the TiO2 material layer deposited on ruthenium (Ru) are reduced by about 68% and about 79%, compared to the material layer deposited on SiO2. In other words, it can be seen that a selective deposition process can be performed by using the simple approach of applying a voltage to ruthenium (Ru) in the step of providing TDMATi.

In addition, as shown in Table 2, TiO2 material layers having substantially the same thickness are deposited on SiO2 and ruthenium (Ru) when no voltage is applied to ruthenium (Ru). However, the thickness of the TiO2 material layer deposited on ruthenium (Ru) is increased by about 134% when +100V is applied to ruthenium (Ru) in the step of providing TDMAHf, compared to the material layer deposited on SiO2. In other words, it can be seen that a selective deposition process can be performed by using the simple approach of applying a voltage to ruthenium (Ru) in the step of providing TDMAHf.

Manufacture of Material Layer According to Experimental Example 4

Figure 24:
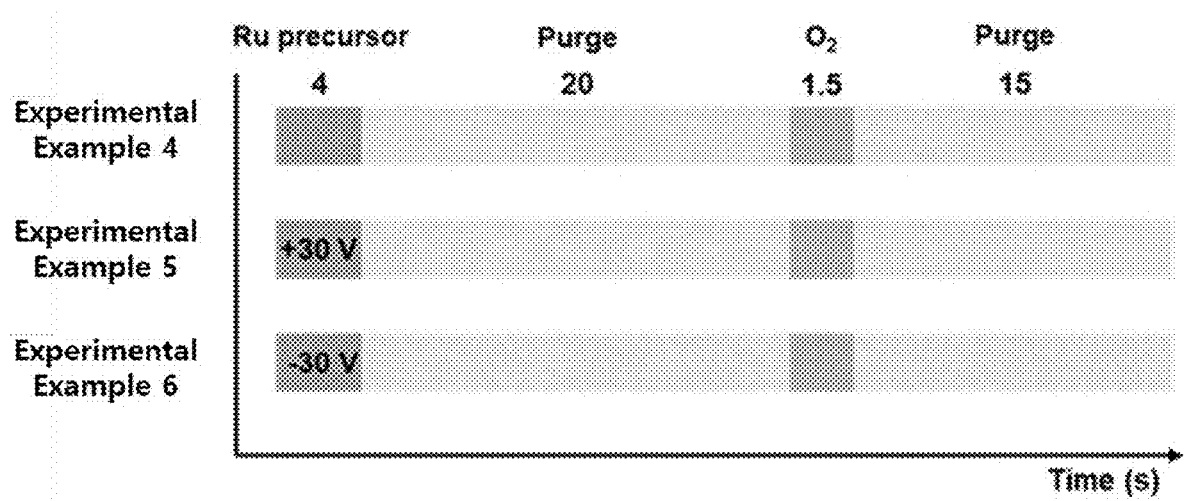
FIG. 24 is a view showing a sequence of the manufacturing process of the material layer according to Experimental Examples 4 to 6 of the present application.

Ethylbenzene-ethylcyclohexadiene-Ru (EBECHRu) was prepared as a ruthenium precursor, and the process of ruthenium precursor injection for 4 seconds-purge for 20 seconds-O2 injection for 1.5 seconds-purge for 15 seconds was defined as 1 cycle and repeatedly performed as shown in FIG. 24, thereby depositing a ruthenium thin layer on the substrate. Since ruthenium is not easily oxidized, and accordingly, a thin layer of pure ruthenium metal may be deposited by using oxygen as reaction gas.

Manufacture of Material Layer According to Experimental Example 5

As shown in FIG. 24, a ruthenium thin layer was deposited under the same conditions as in Experimental Example 4 described above, in which +30V was applied to the substrate upon injection of the ruthenium precursor.

Manufacture of Material Layer According to Experimental Example 6

As shown in FIG. 24, a ruthenium thin layer was deposited under the same conditions as in Experimental Example 4 described above, in which −30V was applied to the substrate upon injection of the ruthenium precursor.

Figure 25:
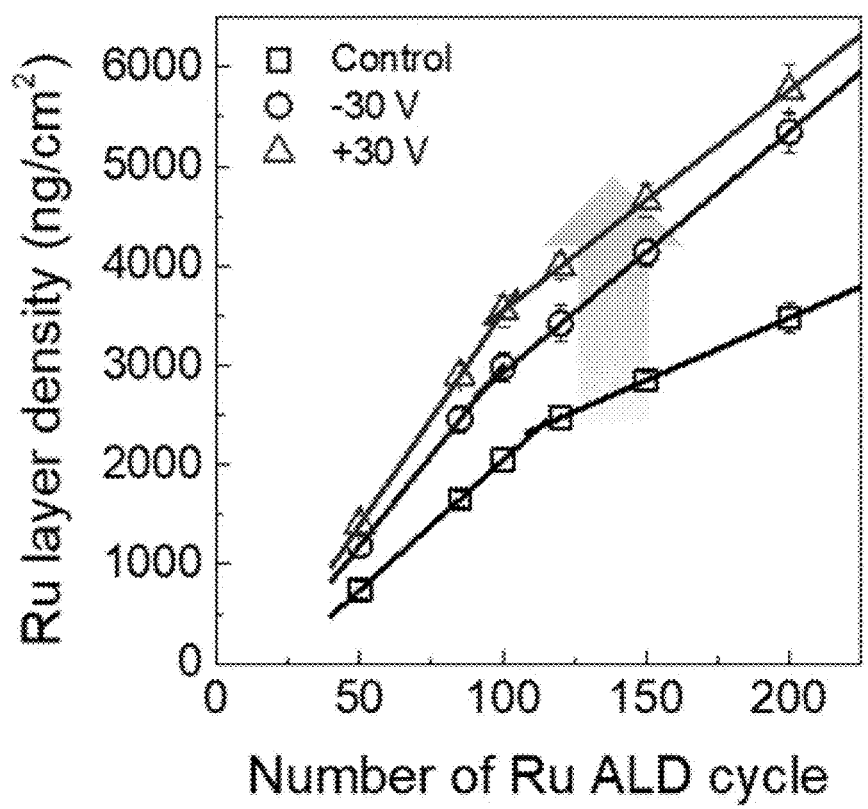
FIG. 25 is a graph obtained by measuring the density of the material layer according to Experimental Examples 4 to 6 of the present application.
Figure 26:
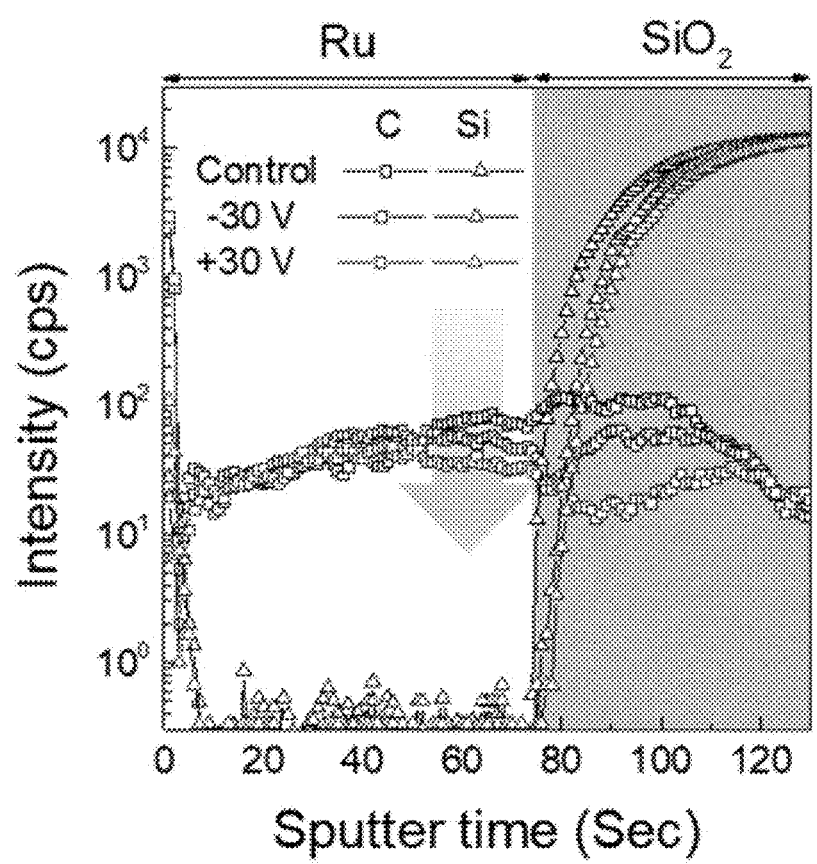
FIG. 26 is a graph obtained by analyzing a composition of the material layer according to Experimental Examples 4 to 6 of the present application.
Figure 27:
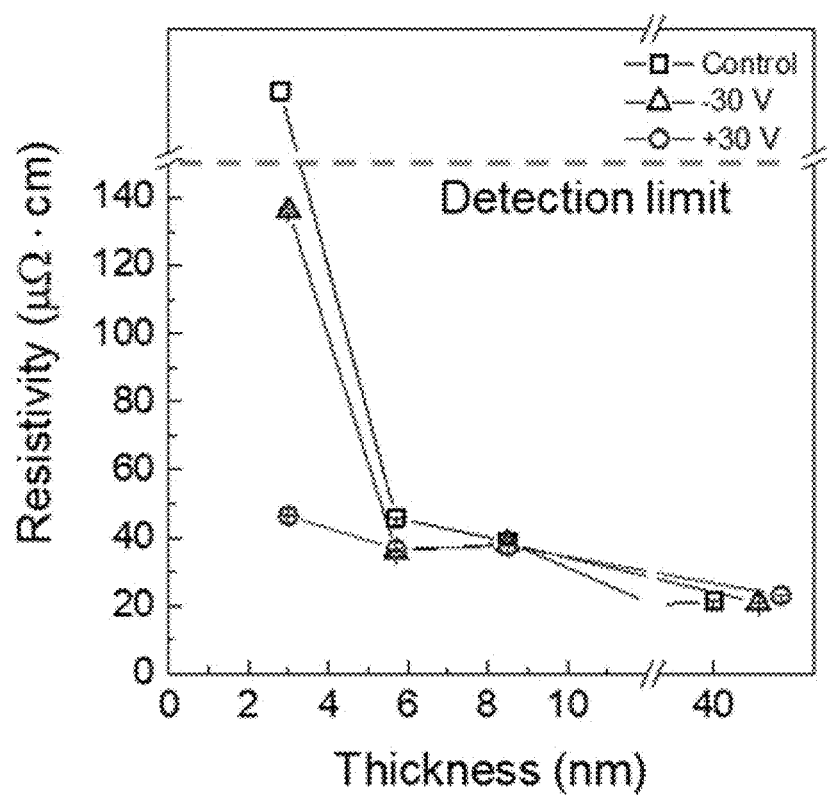
FIG. 27 is a graph obtained by measuring a resistance of the material layer according to Experimental Examples 4 to 6 of the present application.
Figure 28:
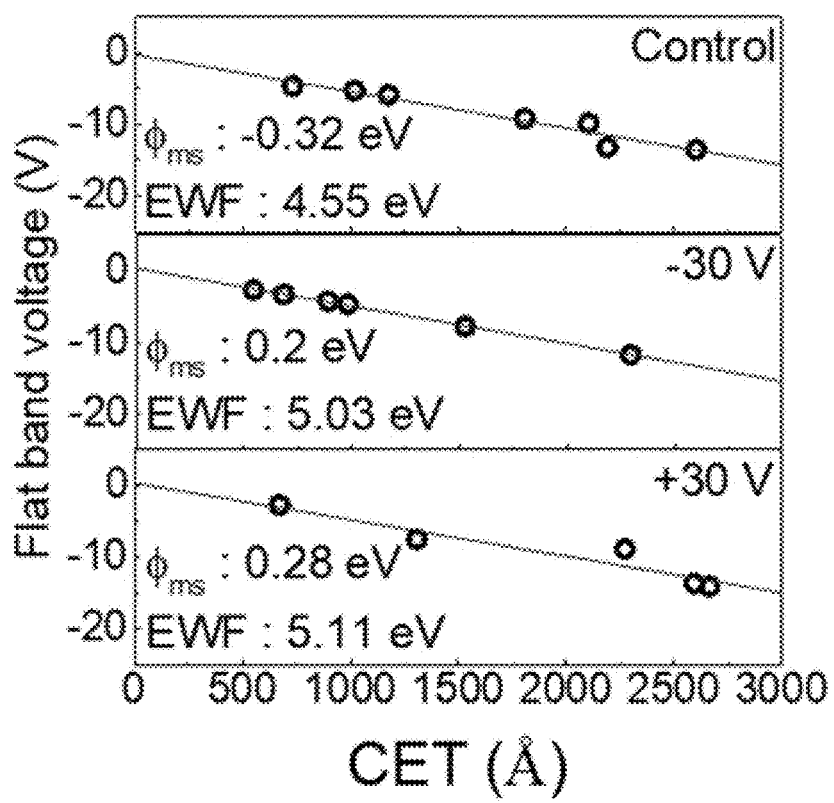
FIG. 28 is a graph obtained by analyzing a work function of the material layer according to Experimental Examples 4 to 6 of the present application.

FIG. 24 is a view showing a sequence of the manufacturing process of the material layer according to Experimental Examples 4 to 6 of the present application. FIG. 25 is a graph obtained by measuring the density of the material layer according to Experimental Examples 4 to 6 of the present application. FIG. 26 is a graph obtained by analyzing a composition of the material layer according to Experimental Examples 4 to 6 of the present application. FIG. 27 is a graph obtained by measuring a resistance of the material layer according to Experimental Examples 4 to 6 of the present application. FIG. 28 is a graph obtained by analyzing a work function of the material layer according to Experimental Examples 4 to 6 of the present application.

Referring to FIGS. 24 to 28, it can be seen that, when a voltage is applied to the substrate during depositing the ruthenium thin layer as shown in FIG. 25, the ruthenium precursor may be easily adsorbed onto the substrate, and accordingly, the density of the thin layer is improved.

In addition, it can be seen that, as shown in FIG. 26, when a voltage is applied to the substrate, the ruthenium precursor is easily adsorbed onto the substrate, and the reaction between the ruthenium precursor and oxygen gas is accelerated, thereby decreasing impurities in the deposited ruthenium thin layer.

In addition, when the voltage is applied to the substrate, physical and chemical properties of the ruthenium thin layer may be improved. Specifically, it can be seen that, as shown in FIG. 27, the resistivity of the thin layer is decreased. In particular, when +30V is applied, the resistance is significantly decreases at a thin thickness of 3 nm. As shown in FIG. 28, it can be seen that the work function is increased due to changes in microstructure and chemical composition of the thin layer.

Manufacture of Material Layer According to Experimental Example 7

The laminated structure shown in FIG. 23 was prepared, in which the laminated structure formed with a TiN pattern instead of a ruthenium pattern was prepared, and ethylbenzene-ethylcyclohexadiene-Ru (EBECHRu) was prepared as a ruthenium precursor. Thereafter, as shown in FIG. 6, the process of ruthenium precursor injection for 4 seconds-purge for 20 seconds-O2 injection for 1.5 seconds-purge for 15 seconds was defined as 1 cycle and repeatedly performed, thereby depositing a ruthenium thin layer, in which no voltage was applied upon injection of the ruthenium precursor or voltages of +30V, −30V, +100V and −100V were applied to the TiN pattern.

Manufacture of Material Layer According to Experimental Example 8

The laminated structure shown in FIG. 23 was prepared, in which the laminated structure formed with a Ti pattern instead of a ruthenium pattern was prepared, and Tetrakis (ethylmethyl)amino-Hf was prepared as a hafnium precursor. Thereafter, as shown in FIG. 6, the process of hafnium precursor injection for 6 seconds-purge for 40 seconds-H2O injection for 6 seconds-purge for 40 seconds was defined as 1 cycle and repeatedly performed, thereby depositing a hafnium oxide thin layer, in which no voltage was applied upon injection of the hafnium precursor or voltages of +30V, −30V, +100V and −100V were applied to the Ti pattern.

Manufacture of Material Layer According to Experimental Example 9

The laminated structure shown in FIG. 23 was prepared, in which Tetrakis(dimethyl)amino-Ti was prepared as a titanium precursor. Thereafter, as shown in FIG. 6, the process of titanium precursor injection for 8 seconds-purge for 30 seconds-H2O injection for 6 seconds-purge for 30 seconds was defined as 1 cycle and repeatedly performed, thereby depositing a titanium oxide thin layer, in which no voltage was applied upon injection of the titanium precursor or voltages of +100V and −100V were applied to the ruthenium pattern.

Figure 29:
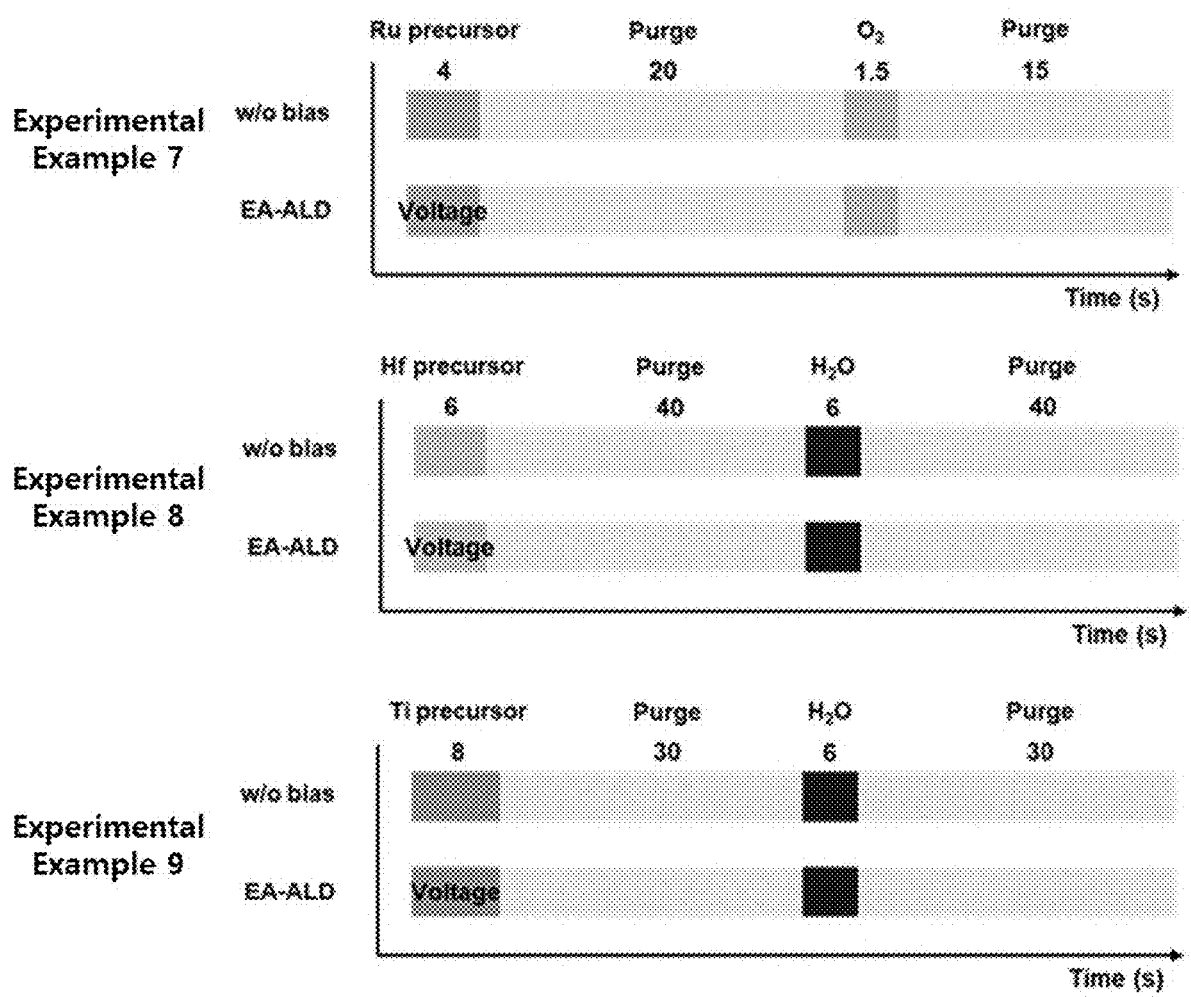
FIG. 29 is a view showing a sequence of the manufacturing process of the material layer according to Experimental Examples 7 to 9 of the present application.
Figure 30:
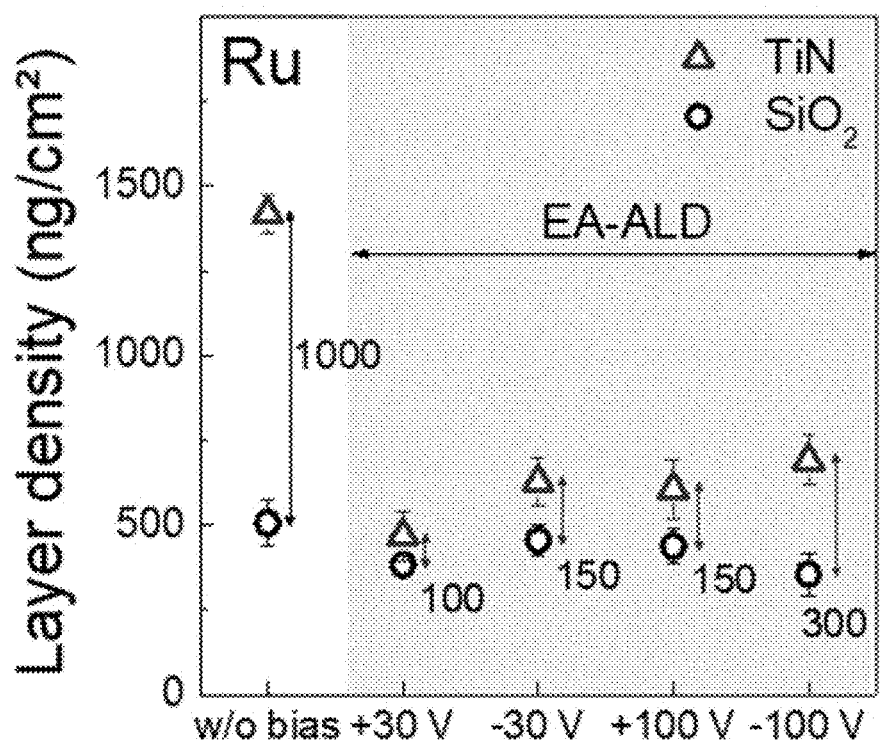
FIG. 30 is a graph obtained by measuring the density of the material layer according to Experimental Example 7 of the present application.
Figure 31:
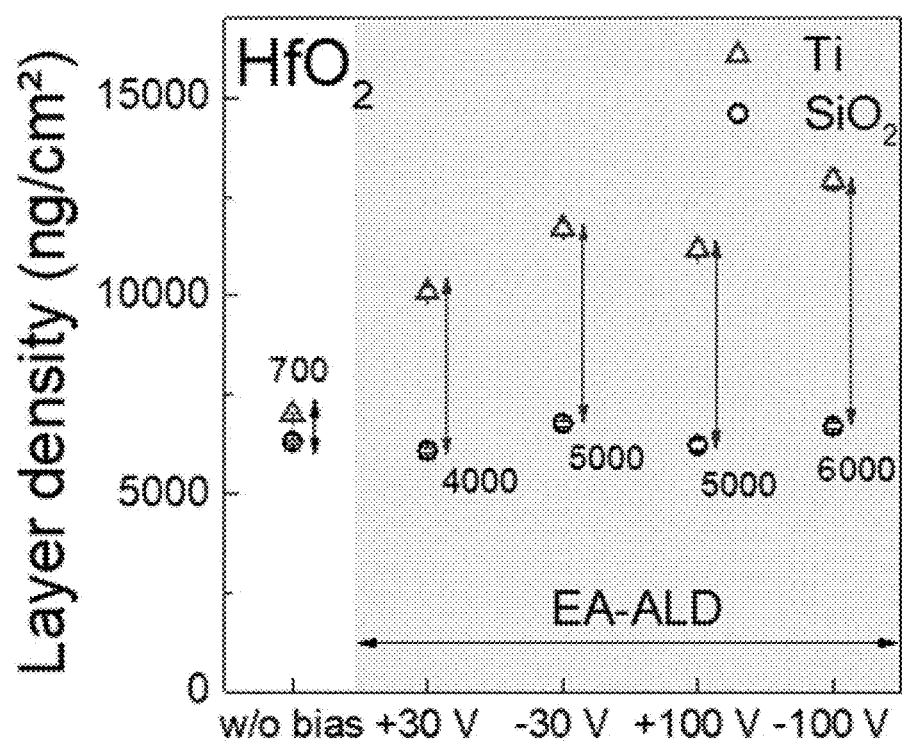
FIG. 31 is a graph obtained by measuring the density of the material layer according to Experimental Example 8 of the present application.
Figure 32:
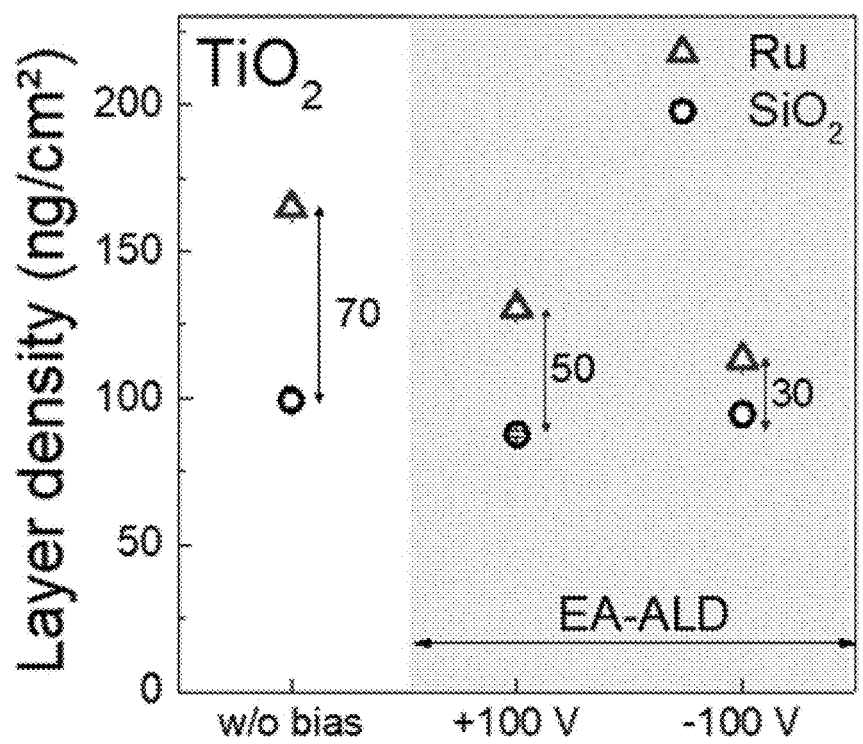
FIG. 32 is a graph obtained by measuring the density of the material layer according to Experimental Example 9 of the present application.

FIG. 29 is a view showing a sequence of the manufacturing process of the material layer according to Experimental Examples 7 to 9 of the present application. FIG. 30 is a graph obtained by measuring the density of the material layer according to Experimental Example 7 of the present application. FIG. 31 is a graph obtained by measuring the density of the material layer according to Experimental Example 8 of the present application. FIG. 32 is a graph obtained by measuring the density of the material layer according to Experimental Example 9 of the present application.

Referring to FIGS. 29 to 32, it can be seen that, when the voltage is applied, the difference in deposition amount of the thin layer between the electrode patterns (TiN, Ti, Ru) and the SiO2 substrate varies. Specifically, it can be seen that, as shown in FIG. 30, in the case of ruthenium precursor, under the condition of applying a voltage, the deposition amount of the thin layer (density of the thin layer) deposited on the electrode pattern is significantly reduced, thereby decreasing the difference in deposition amount (density) between the electrode pattern and the SiO2 substrate.

In addition, it can be seen that, as shown in FIG. 31, in the case of hafnium precursor, the deposition amount (density) is significantly increased under the condition of applying a voltage, thereby significantly increasing the difference in deposition amount (density) between the electrode pattern and the SiO2 substrate.

In addition, it can be seen that, as shown in FIG. 32, in the case of titanium precursor, the deposition amount (density) of the thin layer deposited on the electrode pattern is significantly decreased under the condition of applying a voltage, thereby decreasing the difference in deposition amount (density) between the electrode pattern and the SiO2 substrate.

Deposition and Etching of Material Layer According to Experimental Example 10

While applying a voltage of −100V to the electrode pattern Ti according to Experimental Example 8, a process of depositing a hafnium oxide layer and a process of etching the hafnium oxide layer were alternately and repeatedly performed.

Specifically, the hafnium oxide layer was subjected to a reactive ion etch system and mixed gas of 2 sccm Ar and 2 sccm CF4 was used; plasma power was set to 100 W and process time was set to 90 seconds; an etching process was performed after 50 times of deposition processes; another etching process was performed after 50 times of deposition processes; another etching process was performed after 50 times of deposition processes; and another 50 deposition processes were performed.

Figure 33:
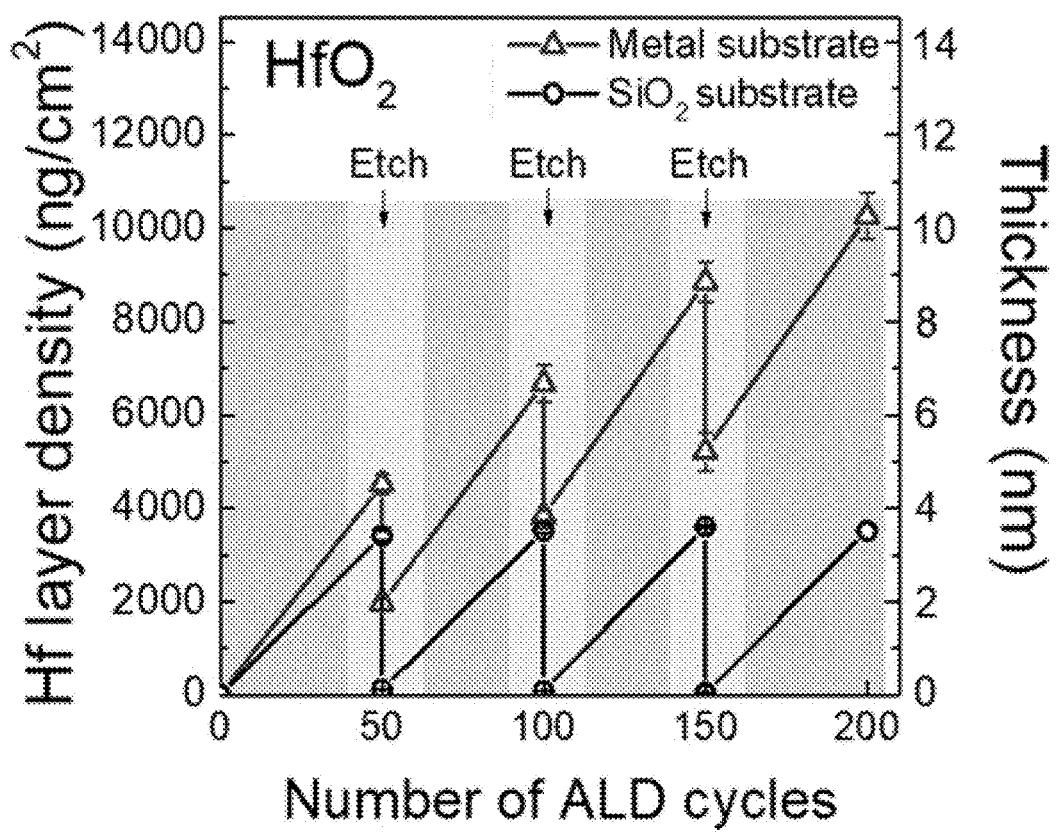
FIG. 33 is a graph obtained by measuring the density and thickness of the material layer in the process of deposition and etching of the material layer according to Experimental Example 10 of the present application.
Figure 34:
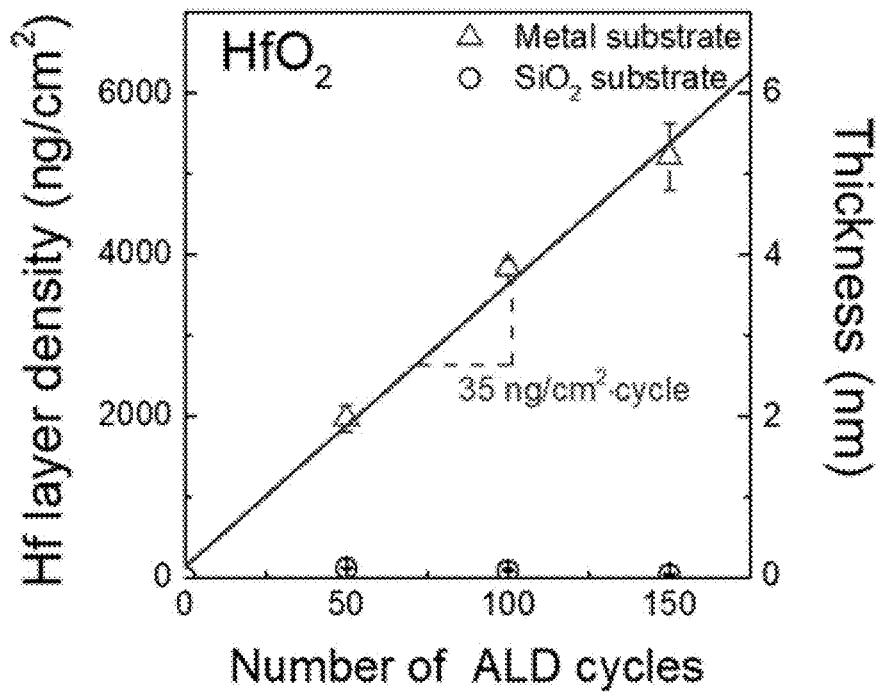
FIG. 34 is a graph obtained by measuring the entire density and thickness of the material layer in the process of deposition and etching of the material layer according to Experimental Example 10 of the present application.

FIG. 33 is a graph obtained by measuring the density and thickness of the material layer in the process of deposition and etching of the material layer according to Experimental Example 10 of the present application. FIG. 34 is a graph obtained by measuring the entire density and thickness of the material layer in the process of deposition and etching of the material layer according to Experimental Example 10 of the present application.

Referring to FIGS. 33 and 34, it can be seen that the hafnium oxide thin layer is deposited thickly with high density under the condition of applying the voltage to the electrode pattern, and it can be seen that, when the etching process proceeds, the hafnium oxide thin layer remains on the electrode pattern, and a hafnium oxide thin layer having high density is deposited on the electrode pattern, thereby having a lower etching amount, compared to the hafnium oxide thin layer deposited on SiO2. Accordingly, it can be seen that, when the deposition and etching processes are repeatedly performed, the hafnium oxide thin layer on SiO2 is removed after deposition, but the hafnium oxide thin layer on the electrode pattern remains and is continuously deposited. In conclusion, it can be seen that a material layer can be selectively formed on an electrode pattern by repeatedly performing the process of depositing a thin layer while applying a voltage to the electrode pattern and the etching process.

Although the present invention has been described in detail using exemplary embodiments, the scope of the present invention is not limited to the specific embodiments, and will be interpreted by the appended claims. In addition, it will be apparent that a person having ordinary skill in the art may carry out various deformations and modifications for the embodiments described as above within the scope without departing from the present invention.

INDUSTRIAL APPLICABILITY

The method of selectively manufacturing a material layer and a target pattern according to an embodiment of the present application may be used in various industrial fields such as memory, logic IC, transistor, sensor, and display.

The invention claimed is:

1. A method of manufacturing a material layer, the method comprising:
   preparing a substrate on which a base pattern is formed;
   providing a first precursor onto the substrate on which the base pattern is formed while a first voltage is applied to the base pattern;
   forming a material layer by reacting the first precursor with a second precursor on the substrate on which the base pattern is formed, by providing the second precursor onto the substrate to which the first precursor is provided while a second voltage is applied to the base pattern; and
   forming a target pattern on the base pattern by providing an etching source on the substrate on which the material layer is formed,
   wherein the etching source selectively etches the material layer so that the material layer deposited on the base pattern remains and the material layer deposited on exposed substrate is removed,
   wherein providing the first precursor, providing the second precursor, and providing the etching source are defined as a unit process, and the unit process is repeatedly performed, and
   wherein a deposition rate of the material layer deposited on the base pattern and a deposition rate of the material layer deposited on the exposed substrate are different from each other.

2. The method of claim 1, wherein the deposition rate of the material layer deposited on the base pattern and the deposition rate of the material layer deposited on the exposed substrate are controlled by controlling the first voltage and the second voltage.

3. The method of claim 1, wherein
   the deposition rate of the material layer deposited on the base pattern is lower than the deposition rate of the material layer deposited on the exposed substrate, and
   the material layer deposited on the base pattern has a thickness smaller than a thickness of the material layer deposited on the exposed substrate.

4. The method of claim 1, wherein
   the deposition rate of the material layer deposited on the base pattern is higher than the deposition rate of the material layer deposited on the exposed substrate, and
   the material layer deposited on the base pattern has a thickness greater than a thickness of the material layer deposited on the exposed substrate.

5. The method of claim 1, wherein the first voltage and the second voltage applied to the base pattern 200 have magnitudes increased, as a number of repetitions of the unit process is increased.

6. The method of claim 1, wherein a time for providing the first precursor and a time for providing the second precursor are increased, as a number of repetitions of the unit process is increased.

7. The method of claim 1, wherein the target pattern has an increased density when the first voltage and the second voltage are applied to the base pattern.

8. The method of claim 1, wherein the target pattern has a decreased resistivity when the first voltage and the second voltage are applied to the base pattern.

9. The method of claim 1, wherein the forming of the target pattern includes: providing the etching source onto the substrate on which the material layer is formed while a third voltage is applied to the base pattern.

* * * * *

UNITED STATES PATENT AND TRADEMARK OFFICE
CERTIFICATE OF CORRECTION

PATENT NO. : 11,976,364 B2
APPLICATION NO. : 17/645077
DATED : May 7, 2024
INVENTOR(S) : Tae Joo Park and Ji Won Han It is certified that error appears in the above-identified patent and that said Letters Patent is hereby corrected as shown below:

In the Claims

In Claim 5, Column 22, Line 34, delete "200".
In Claim 9, Column 22, Line 47, replace "wherein the forming" with --wherein forming--.

Signed and Sealed this
Twentieth Day of August, 2024

Katherine Kelly Vidal
*Director of the United States Patent and Trademark Office*